(12) United States Patent
Uehara et al.

(10) Patent No.: US 12,308,063 B2
(45) Date of Patent: May 20, 2025

(54) FERROELECTRIC THIN FILM, ELECTRONIC ELEMENT USING NAME, AND METHOD FOR MANUFACTURING FERROELECTRIC THIN FILM

(71) Applicant: NATIONAL INSTITUTE OF ADVANCED INDUSTRIAL SCIENCE AND TECHNOLOGY, Tokyo (JP)

(72) Inventors: Masato Uehara, Tosu (JP); Morito Akiyama, Tosu (JP); Hiroshi Yamada, Tosu (JP); Hiroshi Funakubo, Tokyo (JP); Takao Shimizu, Tokyo (JP); Shinnosuke Yasuoka, Tokyo (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 184 days.

(21) Appl. No.: 17/757,932

(22) PCT Filed: Dec. 25, 2020

(86) PCT No.: PCT/JP2020/048846
§ 371 (c)(1),
(2) Date: Jun. 23, 2022

(87) PCT Pub. No.: WO2021/132602
PCT Pub. Date: Jul. 1, 2021

(65) Prior Publication Data
US 2023/0029023 A1    Jan. 26, 2023

(30) Foreign Application Priority Data

Dec. 27, 2019  (JP) ................. 2019-239114
Feb. 27, 2020  (JP) ................. 2020-031428
Aug. 21, 2020  (JP) ................. 2020-140024

(51) Int. Cl.
*H01L 21/02*     (2006.01)
*G11C 11/22*    (2006.01)
(Continued)

(52) U.S. Cl.
CPC ........ *G11C 11/223* (2013.01); *H01L 21/0228* (2013.01); *H10D 64/033* (2025.01); *H10D 64/689* (2025.01)

(58) Field of Classification Search
CPC ............... G11C 11/223; H01L 21/0228; H01L 29/40111; H01L 29/516; C01B 21/0602;
(Continued)

(56) References Cited

U.S. PATENT DOCUMENTS 5,949,071 A * 9/1999 Ruffner ..................... G01J 5/34
                                                                  250/338.3
6,048,738 A * 4/2000 Hsu ........................ H10B 51/30
                                                                  257/E21.663
(Continued)

FOREIGN PATENT DOCUMENTS

JP    2000183295 A    6/2000
JP    2017201050 A    11/2017

OTHER PUBLICATIONS

Akiyama, M. et al., "Enhancement of Piezoelectric Response in Scandium Aluminum Nitride Alloy Thin Films Prepared by Dual Reactive Cosputtering," Advanced Materials, vol. 21, No. 5, Jan. 22, 2009, 4 pages.
(Continued)

*Primary Examiner* — Sheikh Maruf
(74) *Attorney, Agent, or Firm* — McCoy Russell LLP

(57) ABSTRACT

It is an object to provide a ferroelectric thin film having much higher ferroelectric properties than conventional Sc-doped ferroelectric thin film constituted by aluminum nitride and also having stability when applied to practical use, and also to provide an electronic device using the same.
There are provided a ferroelectric thin film represented by a chemical formula $M1_{1-x}M2_xN$, wherein M1 is at least one element selected from Al and Ga, M2 is at least one element selected from Mg, Sc, Yb, and Nb, and X is within a range of 0 or more and 1 or less, and also an electronic device using the same.

17 Claims, 38 Drawing Sheets

(51) Int. Cl.
*H10D 64/01* (2025.01)
*H10D 64/68* (2025.01)

(58) Field of Classification Search
CPC ............ C23C 14/0036; C23C 14/0641; C23C 14/3464; C04B 2235/3852; C04B 2235/3865; C04B 2235/3886; C04B 35/58; C04B 35/581; C30B 29/406; C30B 29/38
USPC ........................................................ 257/295
See application file for complete search history.

(56) References Cited

U.S. PATENT DOCUMENTS

| | | | | |
|---|---|---|---|---|
| 9,142,762 | B1* | 9/2015 | Li | H10N 50/80 |
| 2007/0114594 | A1* | 5/2007 | Ono | G11C 11/5671 257/317 |
| 2009/0242970 | A1* | 10/2009 | Shimizu | H01L 29/40114 257/632 |
| 2010/0224916 | A1* | 9/2010 | Shimizu | H01L 21/02192 257/532 |
| 2014/0246689 | A1* | 9/2014 | Luo | H05B 33/10 257/98 |
| 2015/0171183 | A1* | 6/2015 | Sakai | H01L 21/28194 257/295 |
| 2015/0280112 | A1* | 10/2015 | Li | H10N 50/80 438/3 |
| 2015/0357429 | A1* | 12/2015 | Dubourdieu | H01L 29/513 257/295 |
| 2016/0064510 | A1* | 3/2016 | Mueller | H10B 51/00 257/295 |
| 2016/0336312 | A1* | 11/2016 | Yan | H01L 29/40111 |
| 2018/0240804 | A1* | 8/2018 | Yoo | H01L 21/28088 |
| 2018/0286987 | A1* | 10/2018 | Lee | H01L 29/66969 |
| 2018/0358475 | A1* | 12/2018 | Guo | H01L 29/78696 |
| 2018/0366476 | A1* | 12/2018 | Liu | G11C 11/2273 |
| 2019/0131420 | A1* | 5/2019 | Lu | H01L 29/40111 |
| 2019/0172539 | A1* | 6/2019 | Slesazeck | G11C 11/223 |
| 2019/0244973 | A1* | 8/2019 | Yoo | H01L 21/22 |
| 2019/0393355 | A1* | 12/2019 | Yoo | G11C 11/223 |
| 2020/0020542 | A1* | 1/2020 | Lee | H01L 21/02115 |
| 2020/0075075 | A1* | 3/2020 | Chen | G11C 11/2255 |
| 2020/0105772 | A1* | 4/2020 | Chen | H10B 53/30 |
| 2020/0111511 | A1* | 4/2020 | Yang | H10N 50/01 |
| 2020/0161250 | A1* | 5/2020 | Seo | H01L 21/31116 |
| 2020/0194592 | A1* | 6/2020 | Ionescu | G01N 27/4145 |
| 2020/0312978 | A1* | 10/2020 | Kavalieros | H01L 29/516 |
| 2020/0357927 | A1* | 11/2020 | Hsieh | H10D 30/701 |
| 2020/0388757 | A1* | 12/2020 | Yang | H10N 70/826 |
| 2020/0411695 | A1* | 12/2020 | Sung | H10B 61/00 |
| 2020/0411747 | A1* | 12/2020 | Wagner | H10N 30/045 |
| 2021/0098596 | A1* | 4/2021 | Jo | H01L 21/02356 |
| 2021/0184043 | A1* | 6/2021 | Chia | H10D 64/021 |
| 2021/0265366 | A1* | 8/2021 | Young | H10D 30/0415 |
| 2021/0407848 | A1* | 12/2021 | Chia | H10B 51/20 |

OTHER PUBLICATIONS

Zhang, S. et al., "Tunable optoelectronic and ferroelectric properties in Sc-based III-nitrides," Journal of Applied Physics, vol. 114, No. 3, Oct. 4, 2013, 12 pages.

Uehara, M. et al., "Giant increase in piezoelectric coefficient of AlN by Mg—Nb simultaneous addition and multiple chemical states of Nb," Applied Physics Letters, vol. 111, No. 11, Sep. 11, 2017, 5 pages.

Fichtner, S. et al., "AlScN: A III-V semiconductor based ferroelectric," Journal of Applied Physics, vol. 125, No. 11, Mar. 18, 2019, 8 pages.

ISA Japan Patent Office, International Search Report Issued in Application No. PCT/JP2020/048846, Mar. 30, 2021, WIPO, 6 pages.

Fichtner, S. et al., "Identifying and overcoming the interface originating c-axis instability in highly Sc enhanced AlN for piezoelectric micro-electromechanical systems," Journal of Applied Physics, vol. 122, No. 3, Jul. 21, 2017, 7 pages.

Fichtner, S. et al., "A Generic CMOS Compatible Piezoelectric Multilayer Actuator Approach Based on Permanent Ferroelectric Polarization Inversion in Al1—X ScxN," Proceedings of the 2019 20th International Conference on Solid-State Sensors, Actuators and Microsystems & Eurosensors XXXIII (Transducers & Eurosensors XXXIII), Jun. 23, 2019, Berlin, Germany, 4 pages.

Petrich, R. et al., "Investigation of ScAlN for piezoelectric and ferroelectric applications," Proceedings of the 2019 22nd European Microelectronics and Packaging Conference & Exhibition (EMPC), Sep. 16, 2019, Pisa, Italy, 5 pages.

* cited by examiner

| | Sc CONCENTRATION | Pr ($\mu C/cm^2$) | FILM THICKNESS(nm) | PRODUCTION METHOD |
|---|---|---|---|---|
| EXAMPLE1 | 0.065 | 139 | 132 | PRODUCTION METHOD1 |
| EXAMPLE2 | 0.100 | 138 | 126 | PRODUCTION METHOD1 |
| EXAMPLE3 | 0.160 | 133 | 137 | PRODUCTION METHOD1 |
| EXAMPLE4 | 0.190 | 150 | 290 | PRODUCTION METHOD2 |
| EXAMPLE5 | 0.219 | 129 | 139 | PRODUCTION METHOD1 |
| COMPARATIVE EXAMPLE1 | 0.270 | 115 | 400 | NON-PATENT LITERATURE1 |
| COMPARATIVE EXAMPLE2 | 0.320 | 105 | 600 | NON-PATENT LITERATURE1 |
| COMPARATIVE EXAMPLE3 | 0.360 | 100 | 600 | NON-PATENT LITERATURE1 |
| COMPARATIVE EXAMPLE4 | 0.400 | 95 | 600 | NON-PATENT LITERATURE1 |
| COMPARATIVE EXAMPLE5 | 0.430 | 80 | 1000 | NON-PATENT LITERATURE1 |
| COMPARATIVE EXAMPLE6 | 0.270 | 124 | 136 | PRODUCTION METHOD1 |
| COMPARATIVE EXAMPLE7 | 0.340 | 97 | 138 | PRODUCTION METHOD1 |
| COMPARATIVE EXAMPLE8 | 0.430 | 100 | 440 | PRODUCTION METHOD2 |
| COMPARATIVE EXAMPLE9 | 0.450 | 50 | 460 | PRODUCTION METHOD2 |
| COMPARATIVE EXAMPLE10 | 0.490 | 100 | 420 | PRODUCTION METHOD2 |

FIG. 3

|  | Sc CONCENTRATION | FILM THICKNESS (nm) |
|---|---|---|
| EXAMPLE6 | 0.21 | 79 |
| EXAMPLE7 | 0.22 | 48 |
| EXAMPLE8 | 0.21 | 23 |

FIG. 12

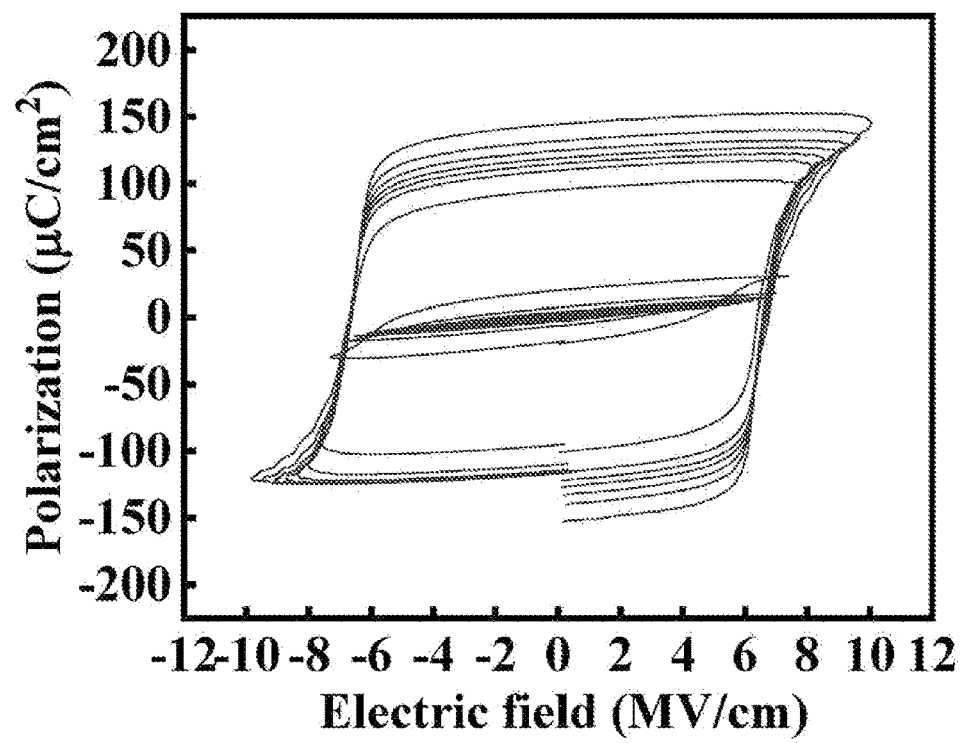
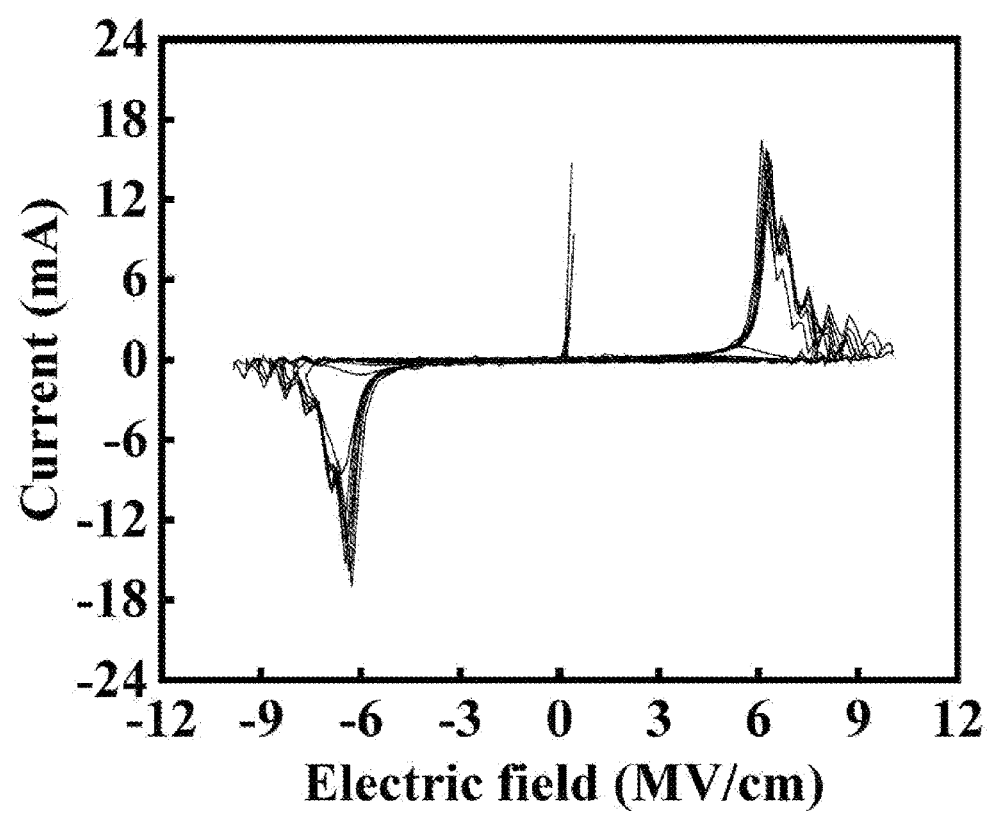
FIG. 13

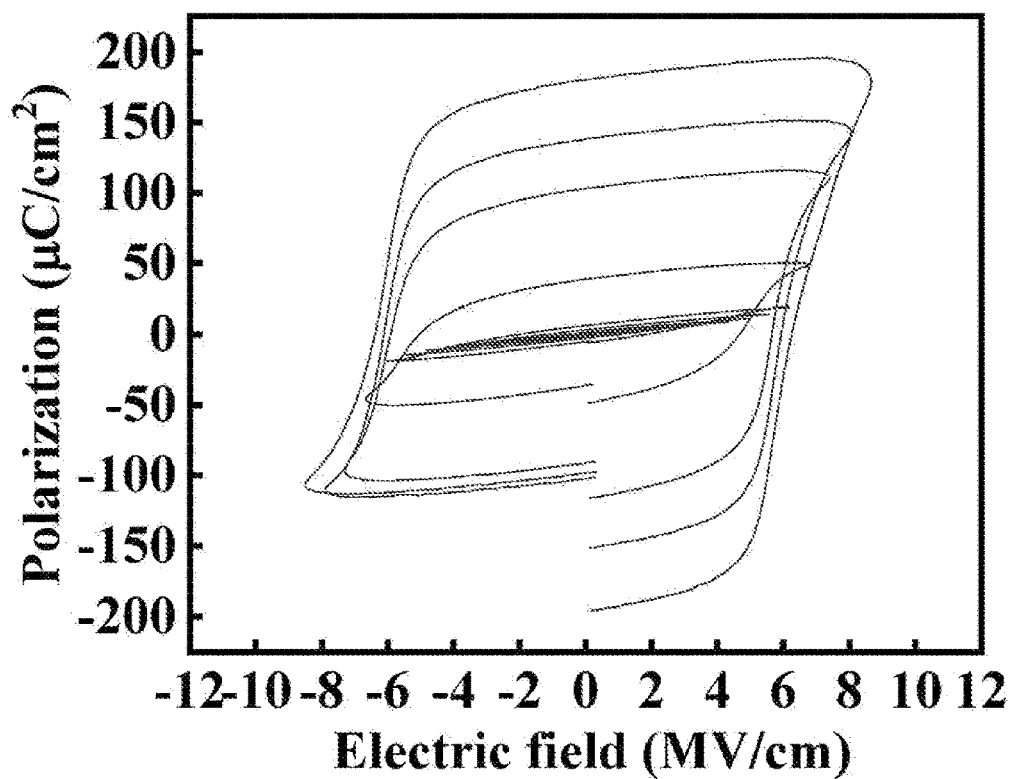
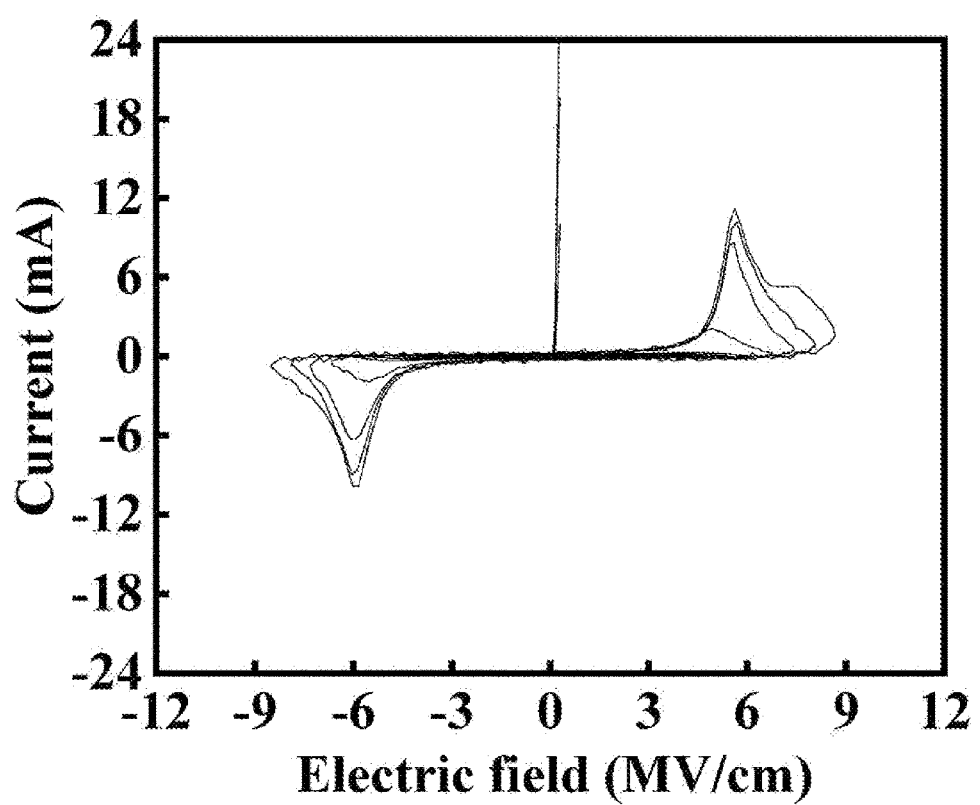
FIG. 14

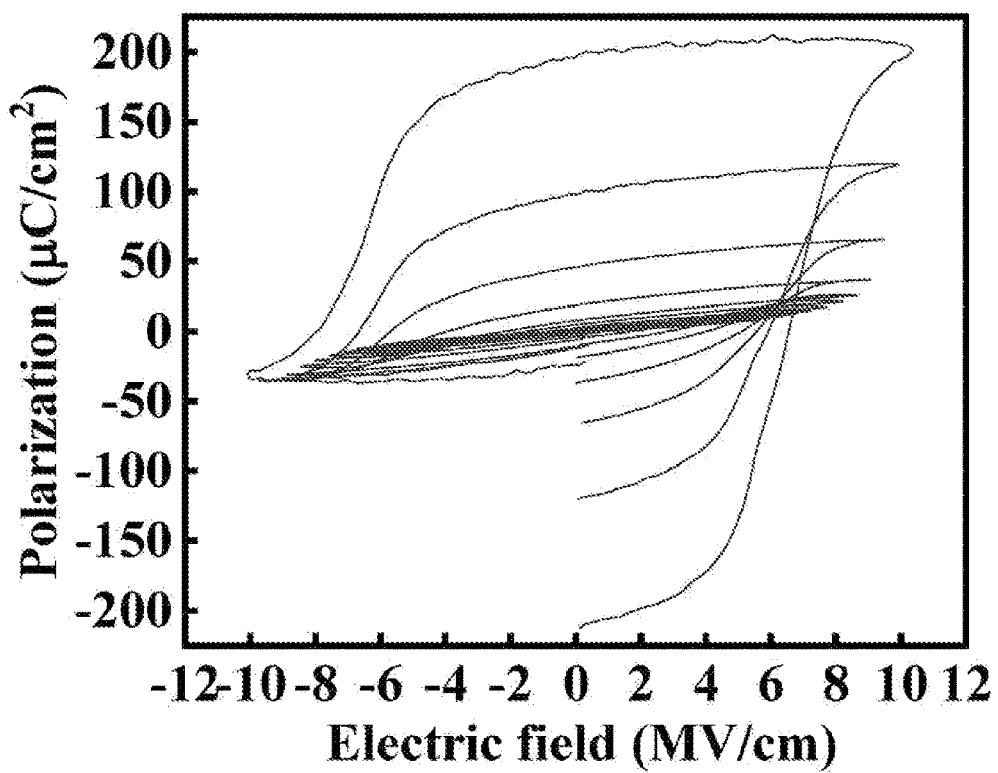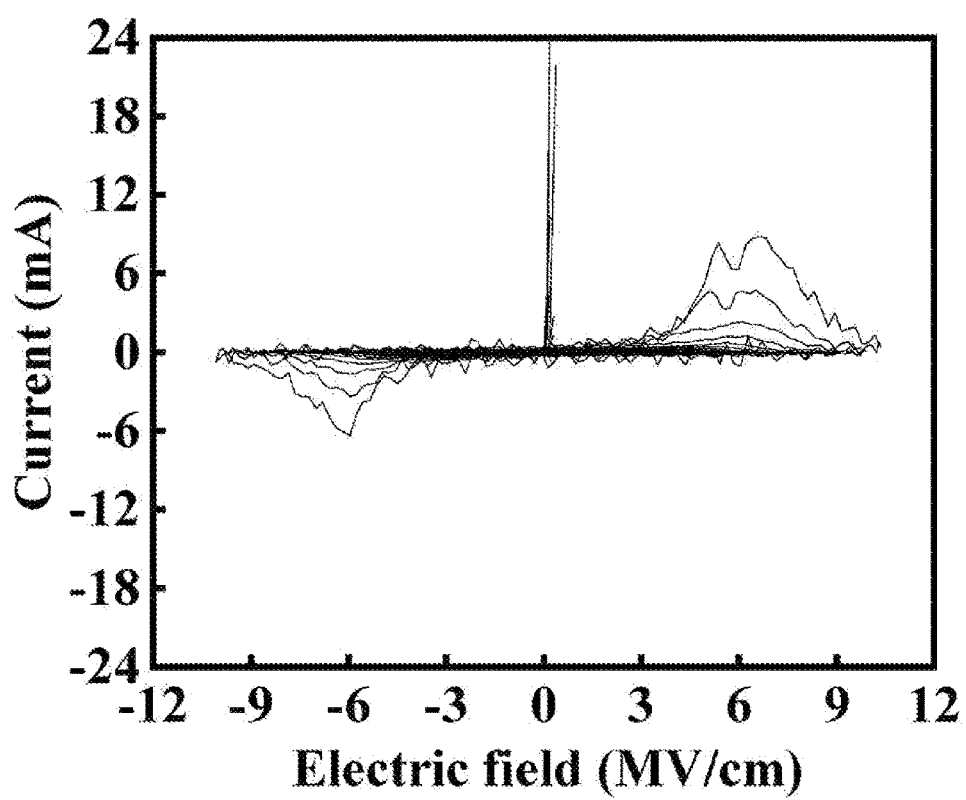
FIG. 15

| | FERROELECTRIC THIN FILM | THICKNESS OF FERROELECTRIC THIN FILM(nm) | ITO LAYER | THICKNESS OF ITO LAYER(nm) | BASE MATERIAL (Substrate) |
|---|---|---|---|---|---|
| EXAMPLE9 | Al$_{0.78}$Sc$_{0.22}$N | 138 | amorphous ITO | 150 | PET |
| EXAMPLE10 | Al$_{0.79}$Sc$_{0.21}$N | 138 | ITO | 150 | Polyimide |
| EXAMPLE11 | Al$_{0.78}$Sc$_{0.22}$N | 137 | amorphous ITO | 150 | Polyimide |
| EXAMPLE12 | Al$_{0.80}$Sc$_{0.20}$N | 145 | ITO | 155 | alkali-free glass |
| EXAMPLE13 | Al$_{0.79}$Sc$_{0.21}$N | 140 | ITO | 154 | soda-lime glass |

FIG. 17

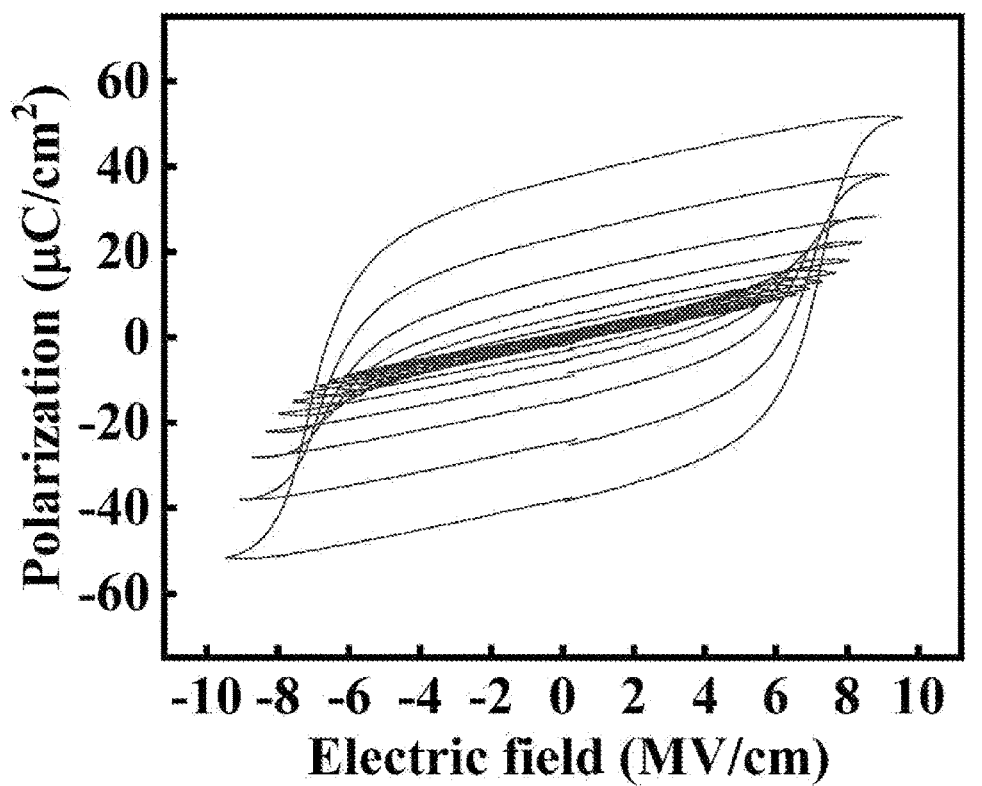
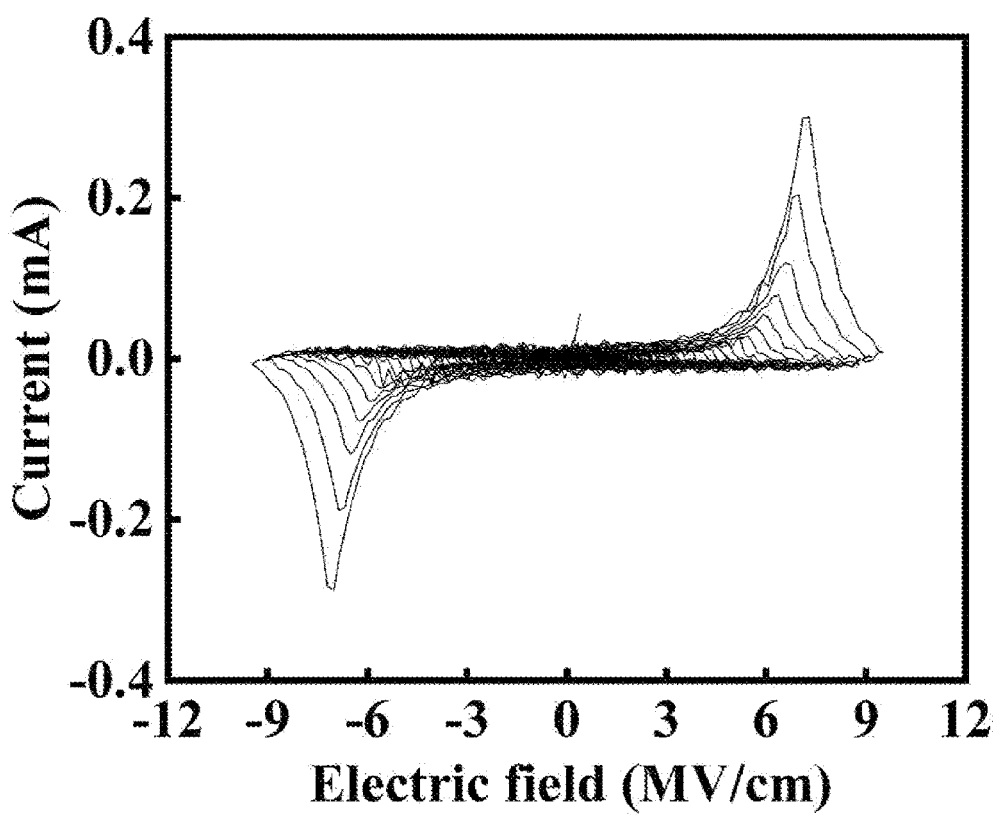
FIG. 18

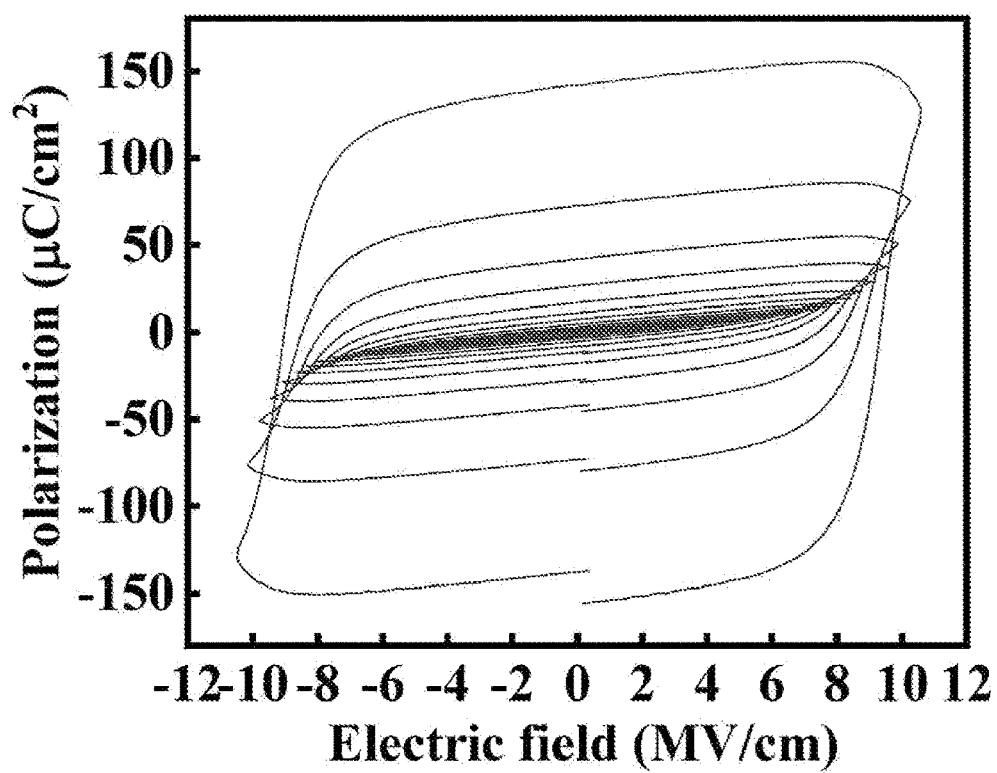
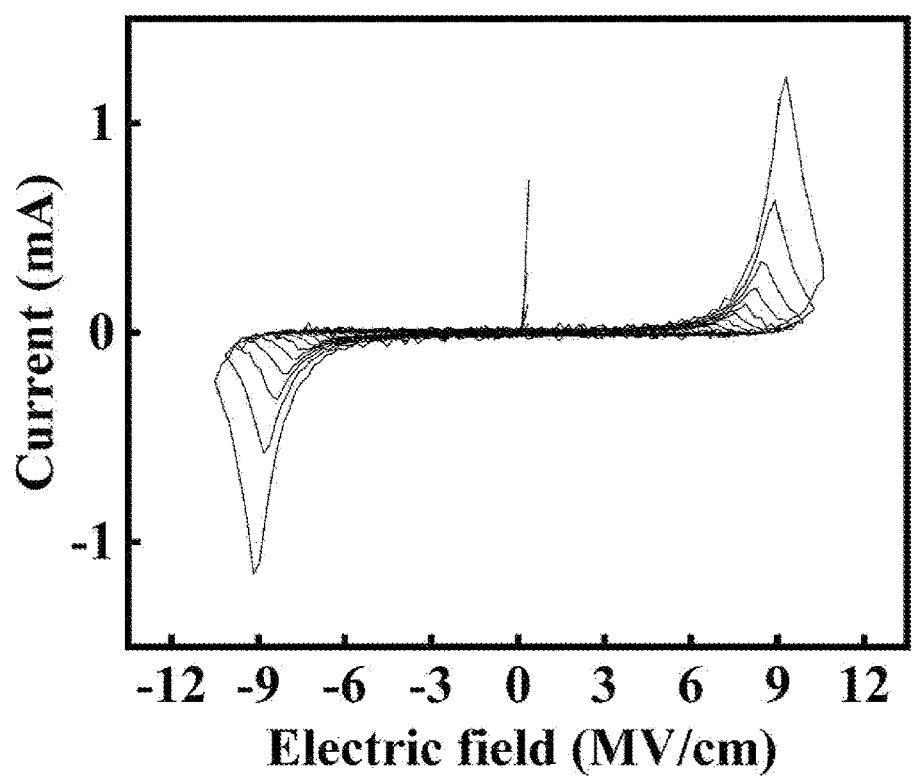
FIG. 22

| | FERROELECTRIC THIN FILM | LAMINATING ORDER | FERROELECTRIC LAYER THICKNESS(nm) |
|---|---|---|---|
| EXAMPLE14 | $Al_{0.37}Mg_{0.4}Nb_{0.23}N$ | $Al_{0.37}Mg_{0.4}Nb_{0.23}N/Si$ | 1084 |
| EXAMPLE15 | $Al_{0.42}Mg_{0.37}Nb_{0.21}N$ | $Al_{0.42}Mg_{0.37}Nb_{0.21}N/Si$ | 841 |
| EXAMPLE16 | $Al_{0.43}Mg_{0.35}Nb_{0.22}N$ | $Al_{0.43}Mg_{0.35}Nb_{0.22}N/Si$ | 1113 |
| EXAMPLE17 | $Ga_{0.914}Sc_{0.086}N$ | $Ga_{0.914}Sc_{0.086}N/Hf$ | 388 |
| EXAMPLE18 | $Ga_{0.826}Sc_{0.174}N$ | $Ga_{0.826}Sc_{0.174}N/Hf$ | 374 |
| EXAMPLE19 | $Ga_{0.65}Sc_{0.35}N$ | $Ga_{0.65}Sc_{0.35}N/Hf$ | 477 |
| EXAMPLE20 | $Ga_{0.59}Sc_{0.41}N$ | $Ga_{0.59}Sc_{0.41}N/Hf$ | 528 |
| EXAMPLE21 | $Ga_{0.68}Sc_{0.32}N$ | $Ga_{0.68}Sc_{0.32}N/Mo/Ti$ | 477 |
| EXAMPLE22 | GaN | GaN/Hf/Si | 561 |
| EXAMPLE23 | GaN | GaN/Si | 612 |
| EXAMPLE24 | $Al_{0.75}Yb_{0.25}N$ | $Al_{0.75}Yb_{0.25}N/Si$ | 560 |

FIG. 23

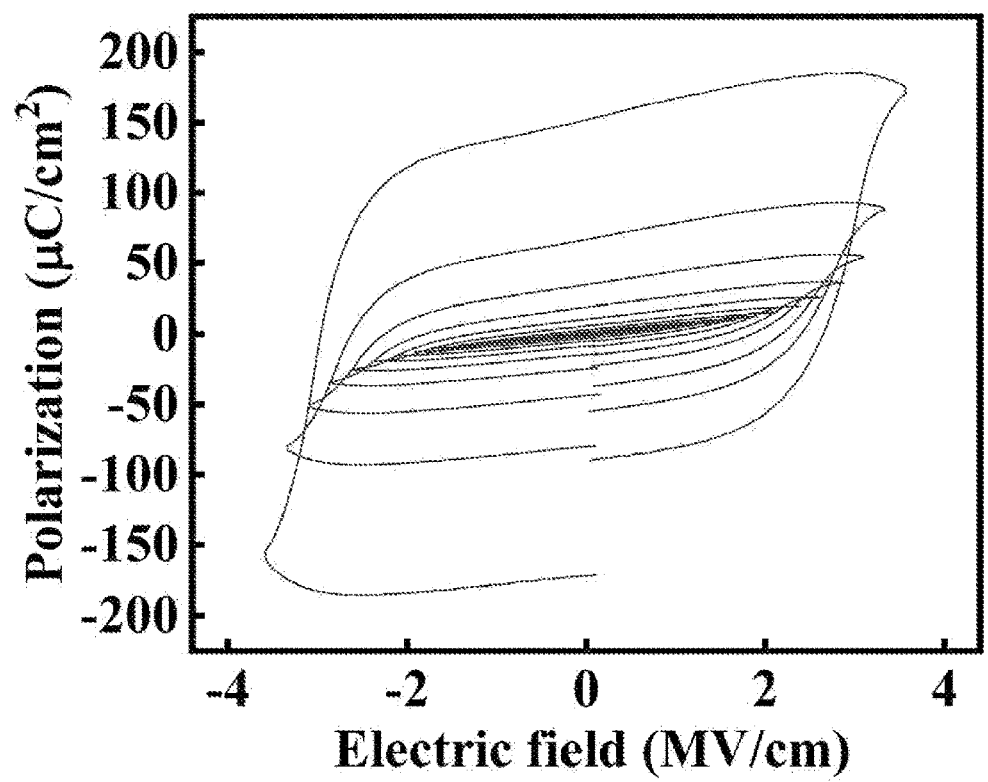
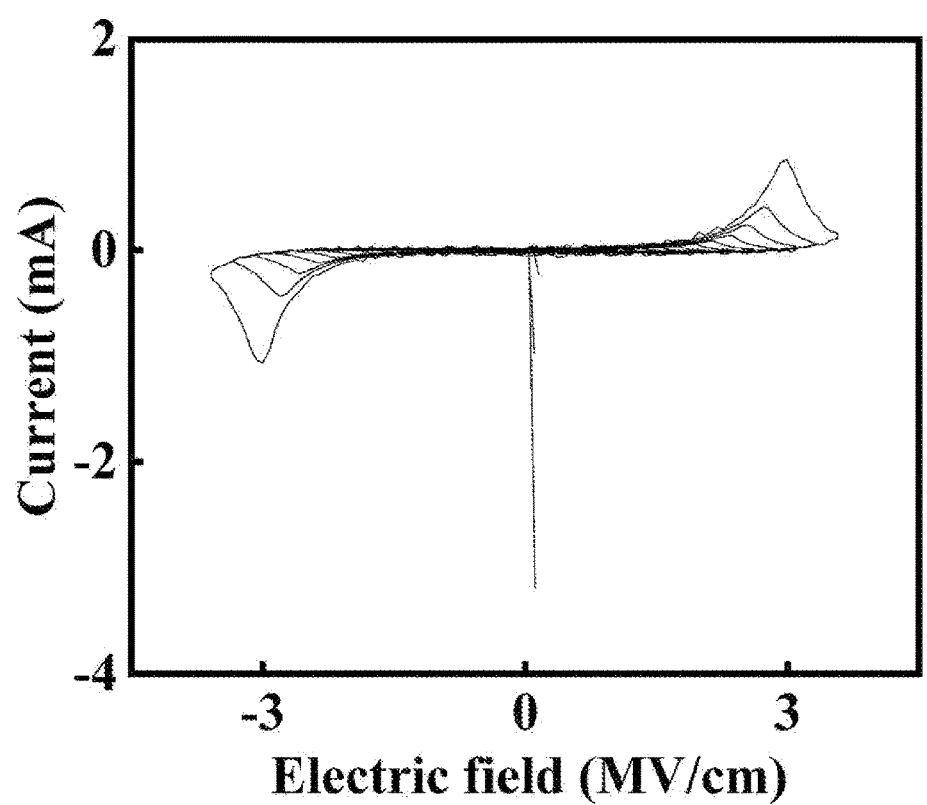
FIG. 25

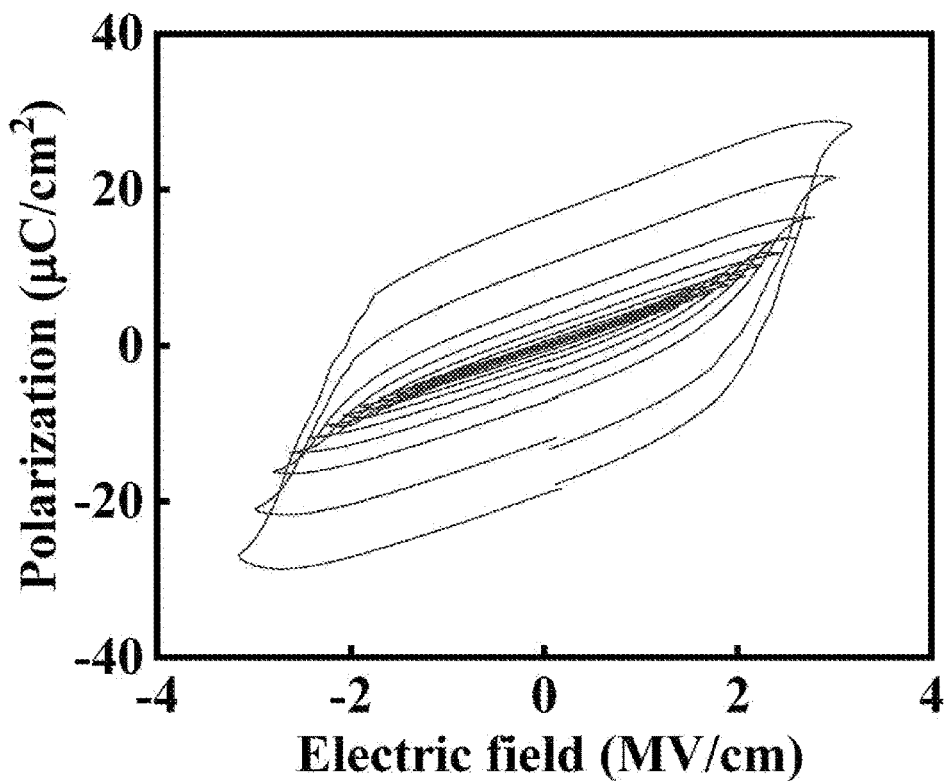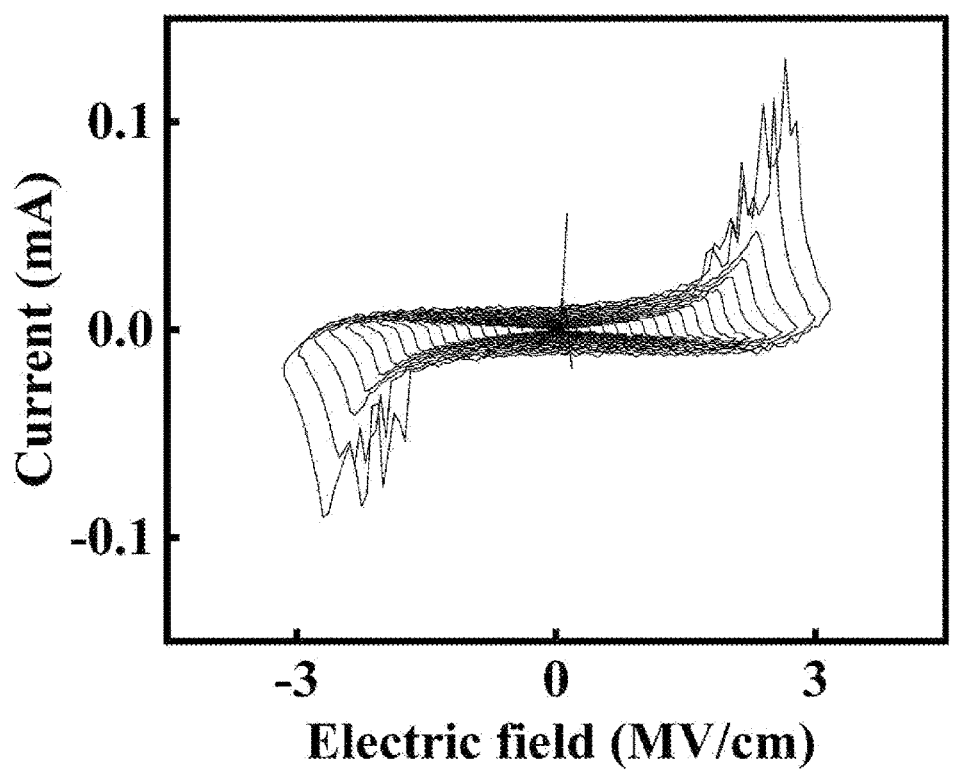
FIG. 26

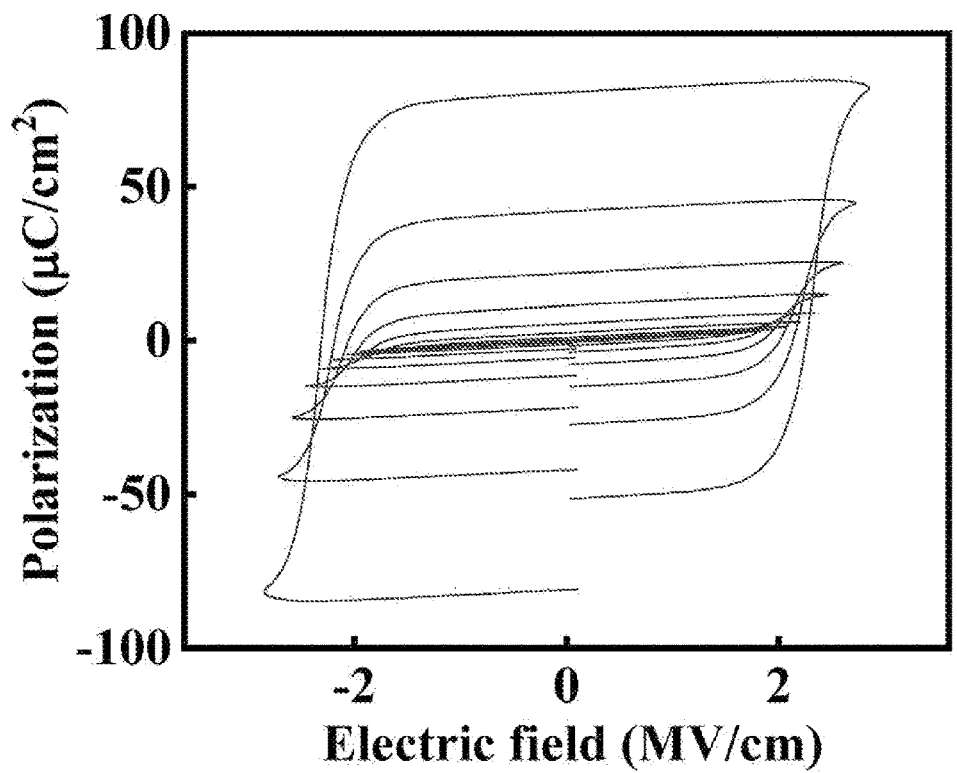
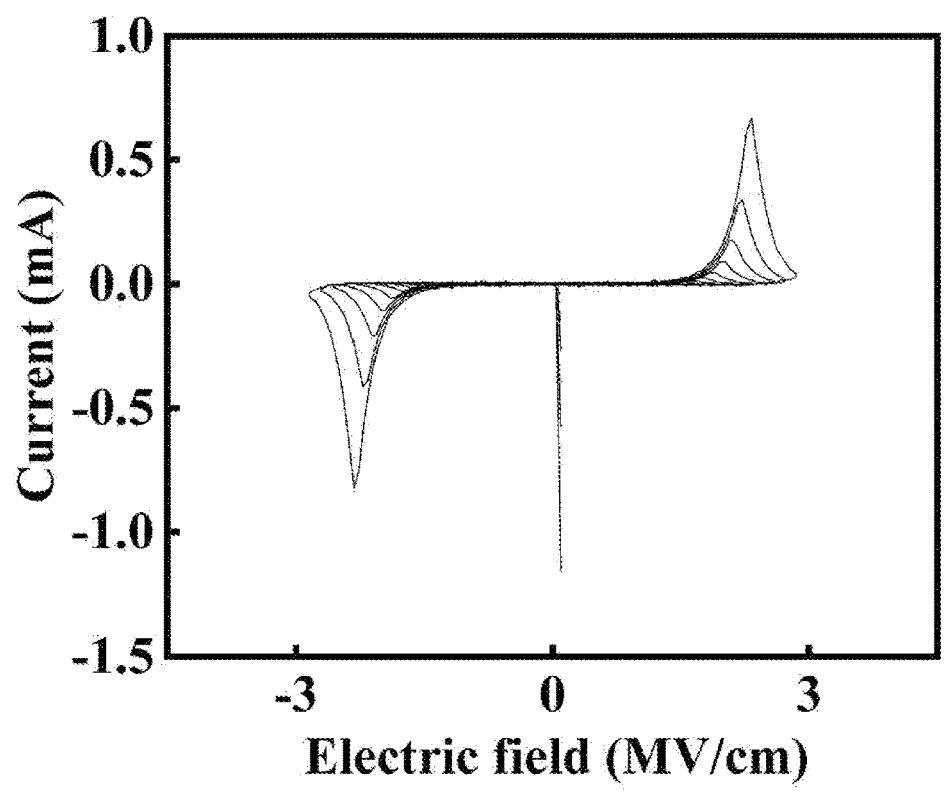
FIG. 27

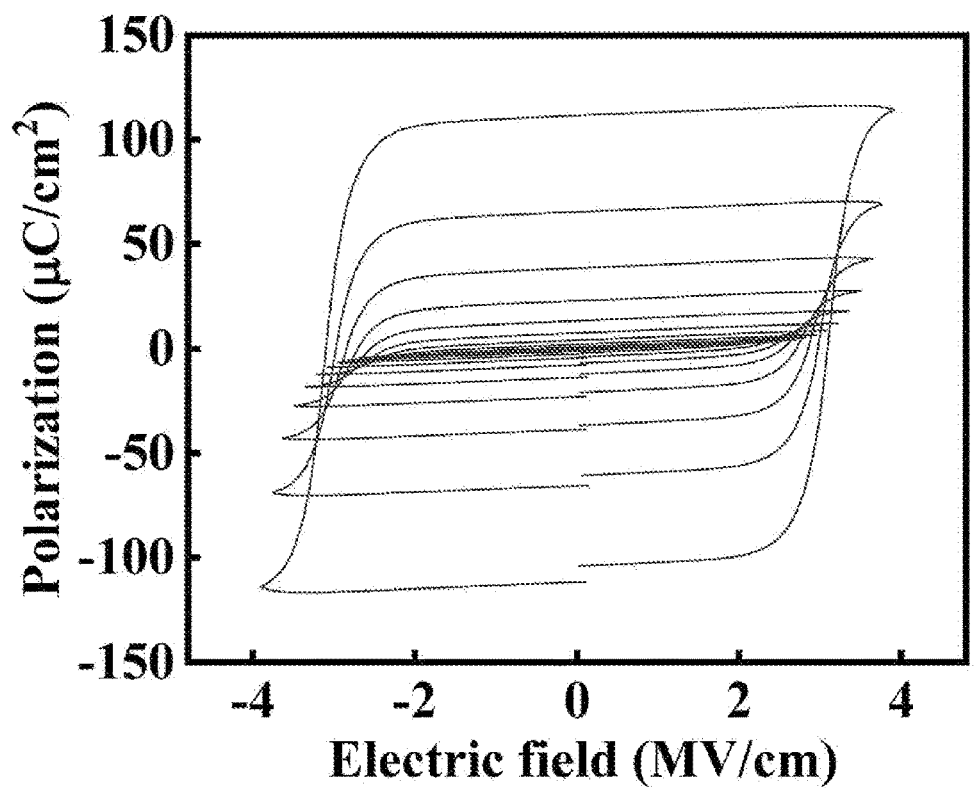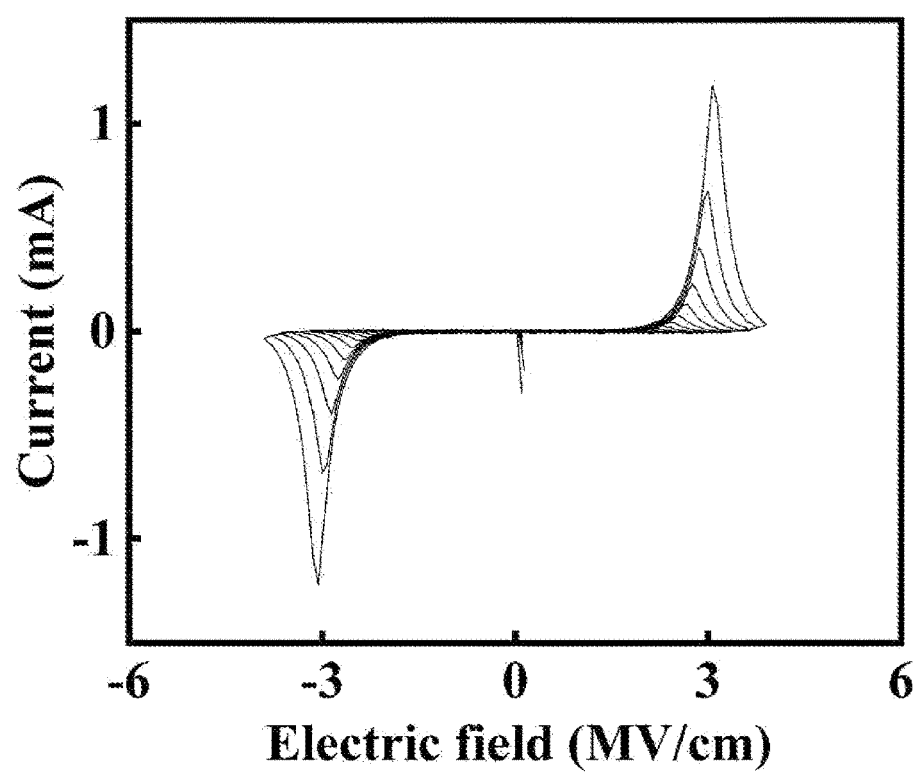
FIG. 28

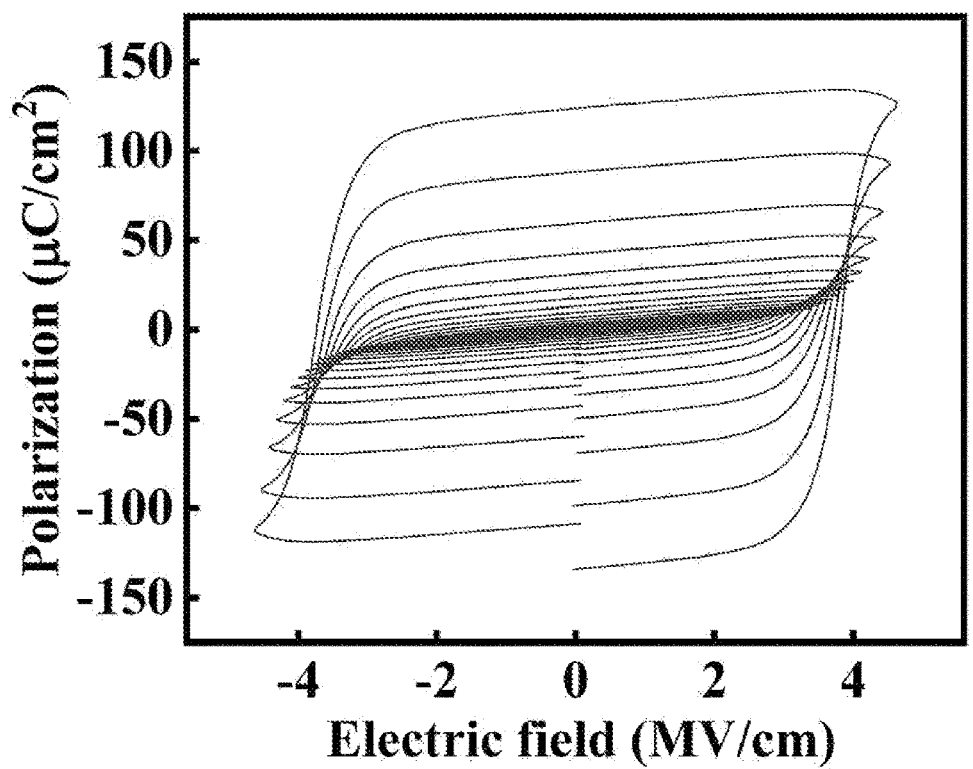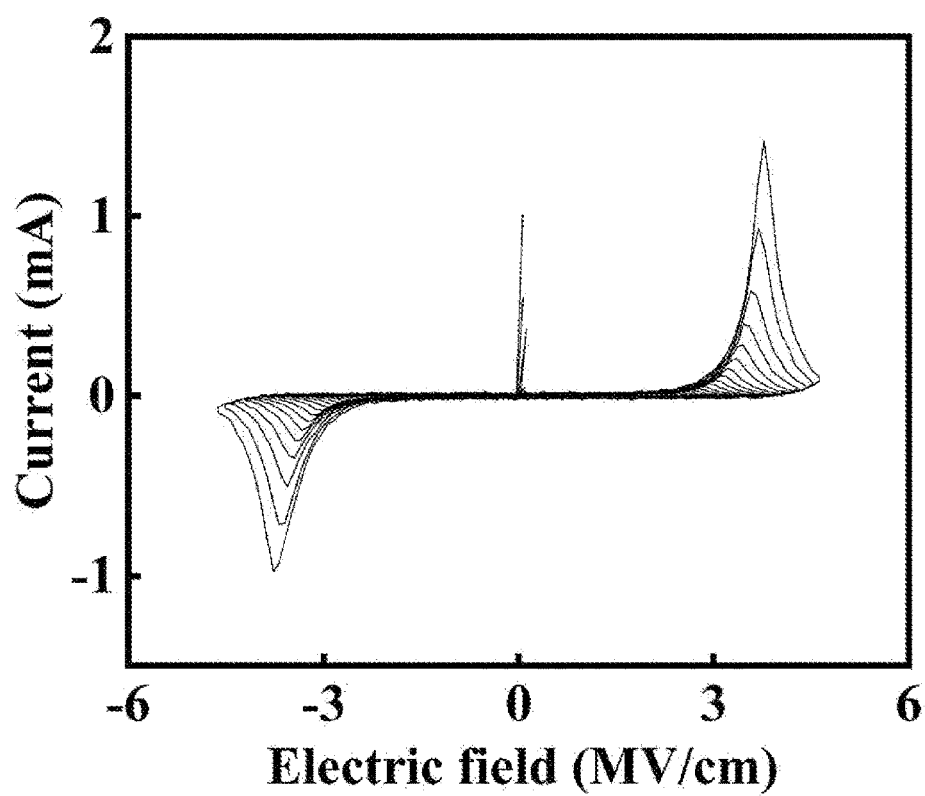
FIG. 29

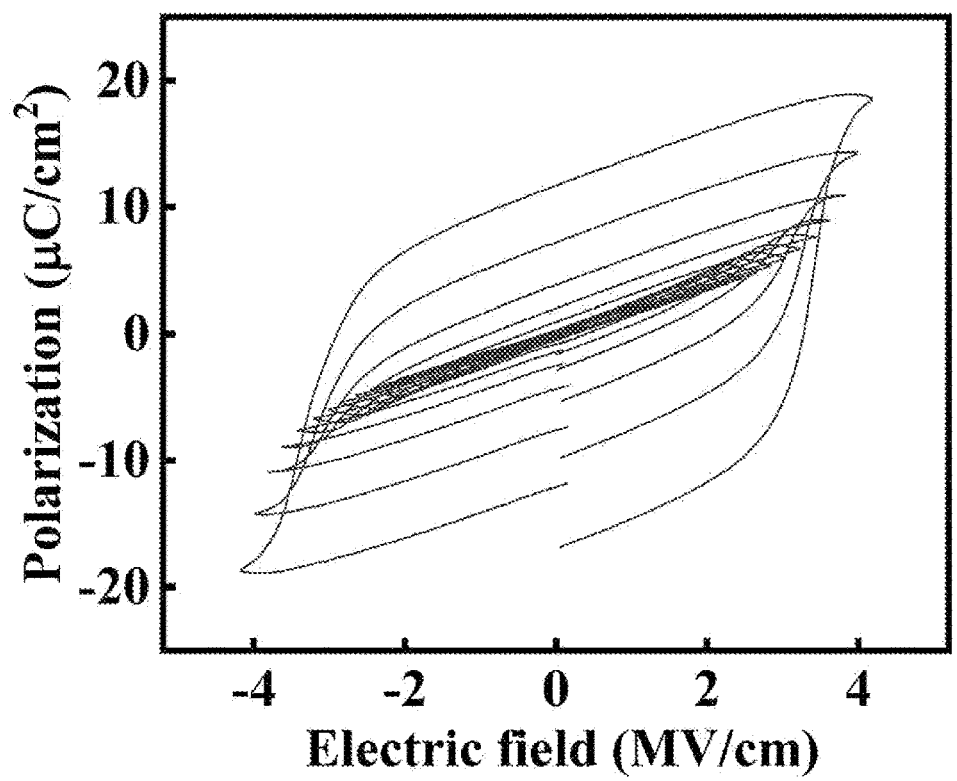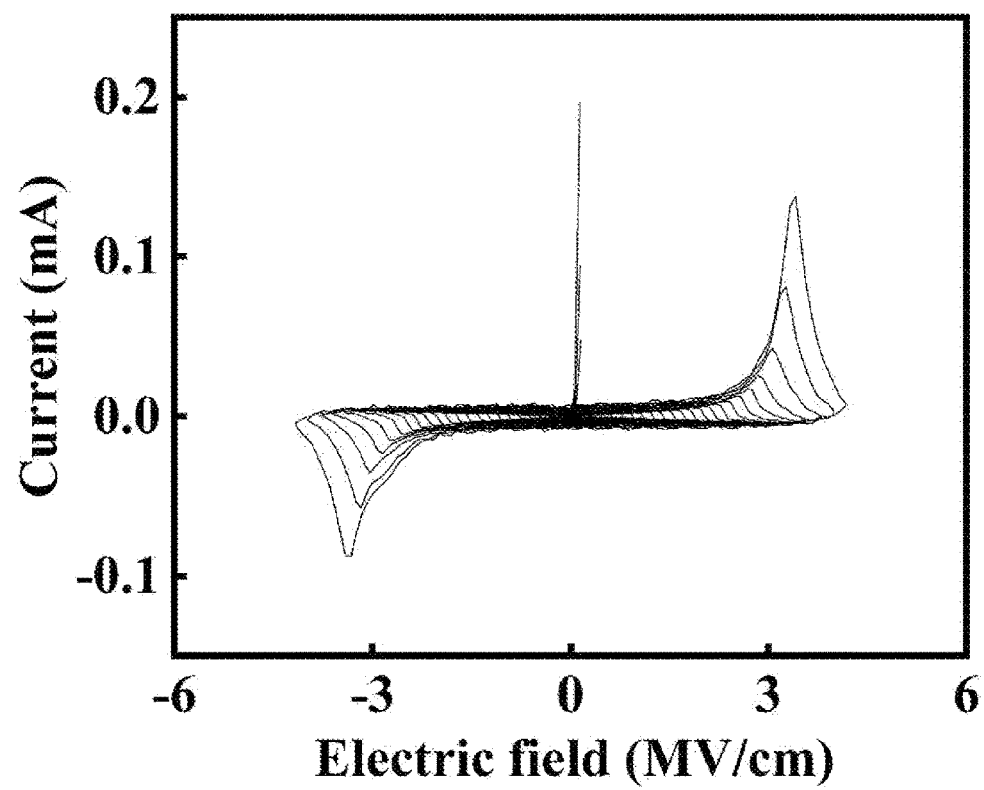
FIG. 30

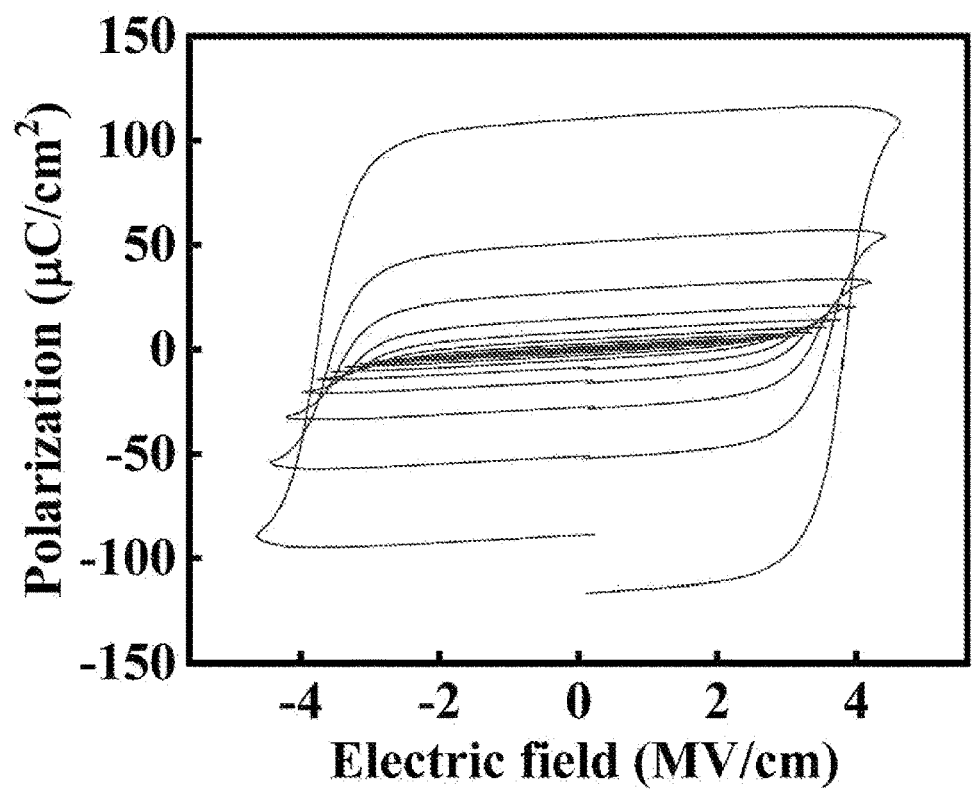
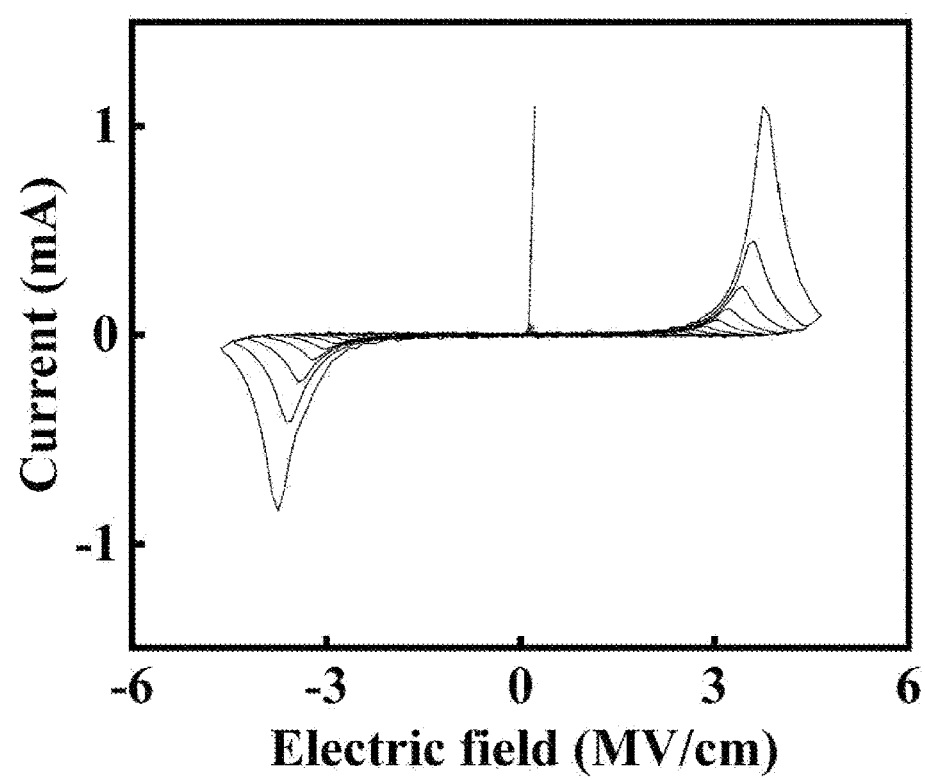
FIG. 31

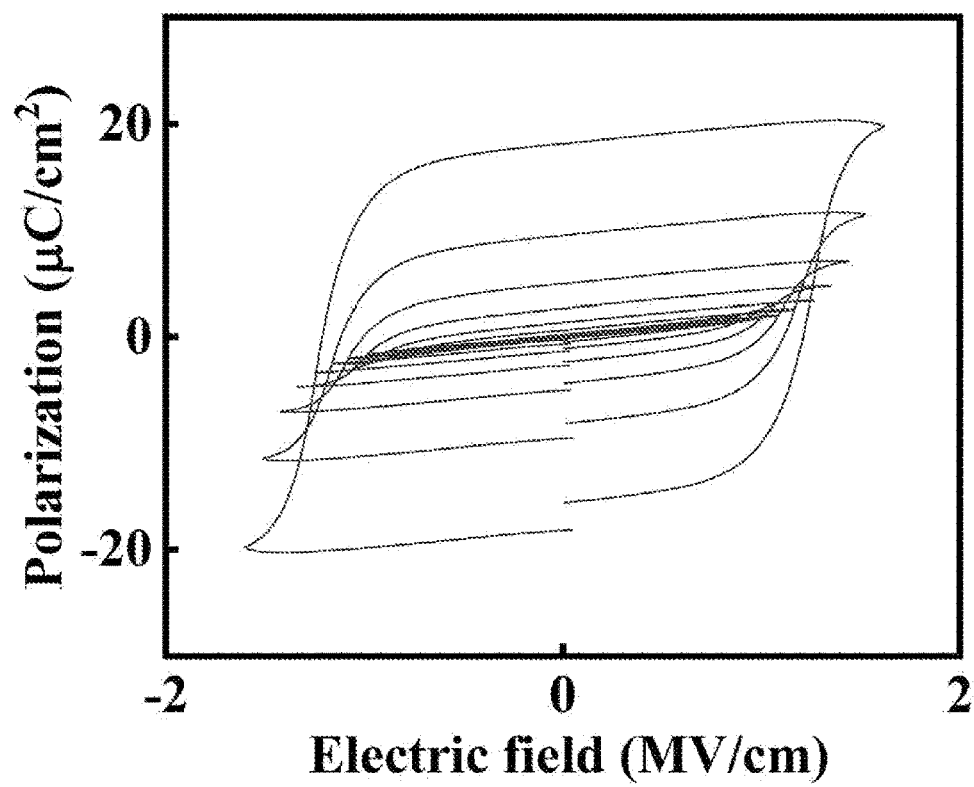
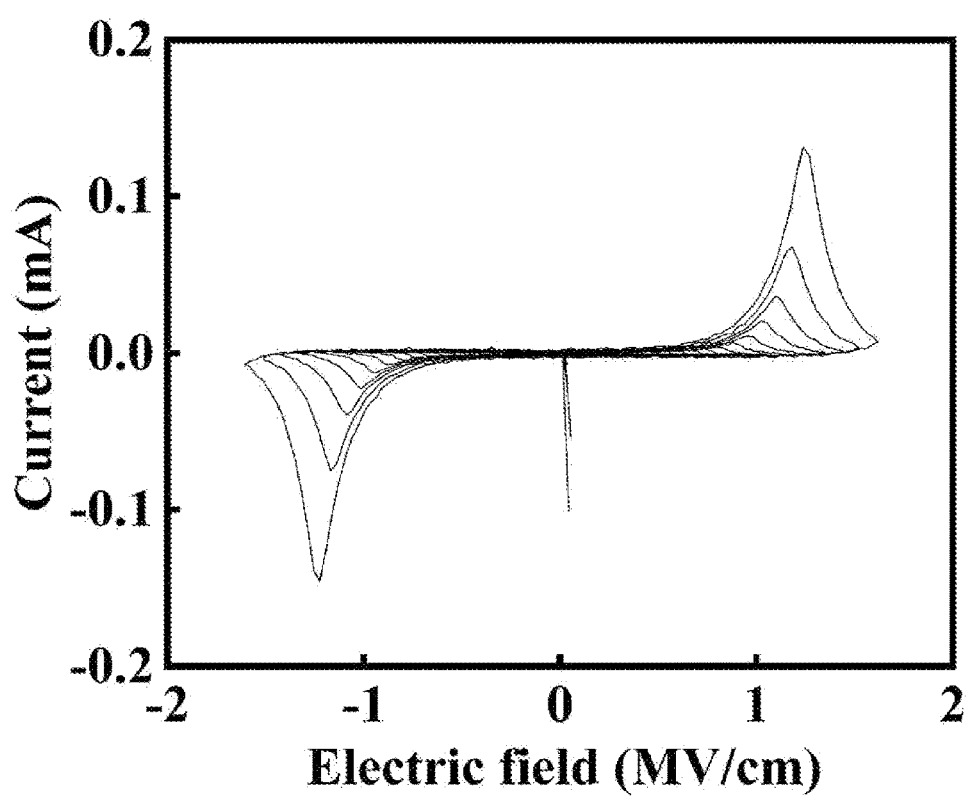
FIG. 32

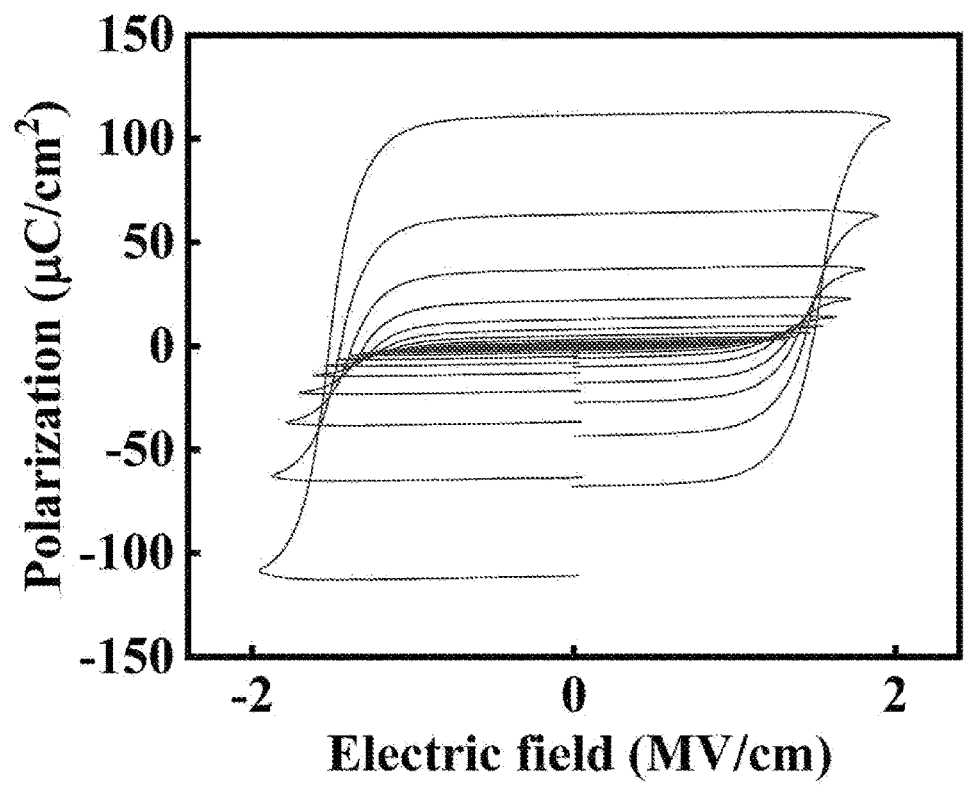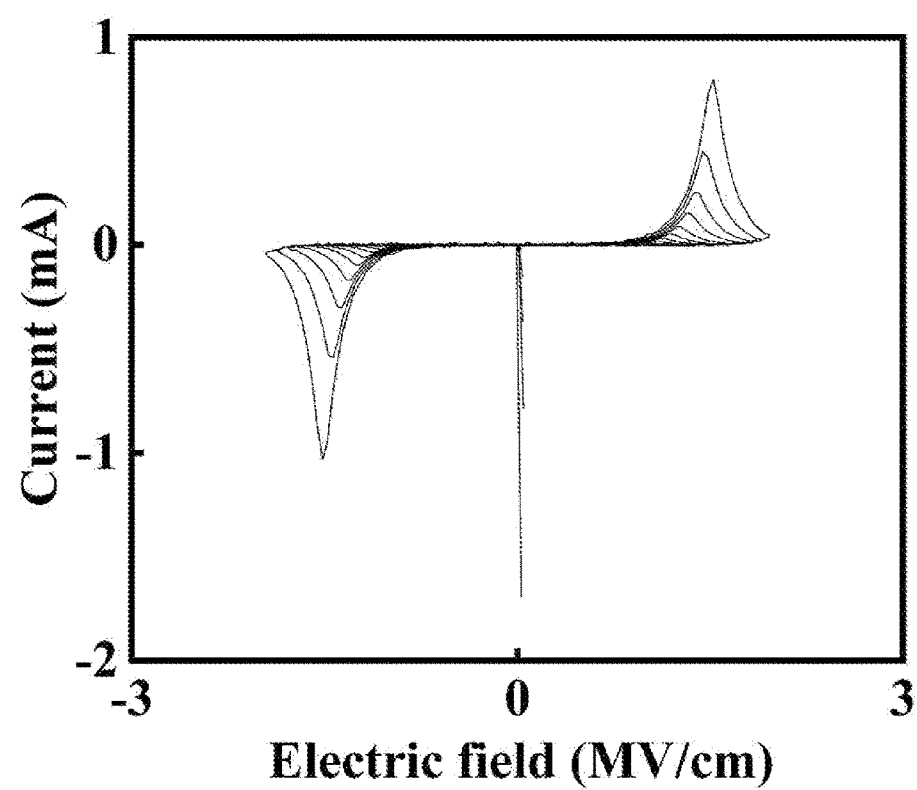
FIG. 33

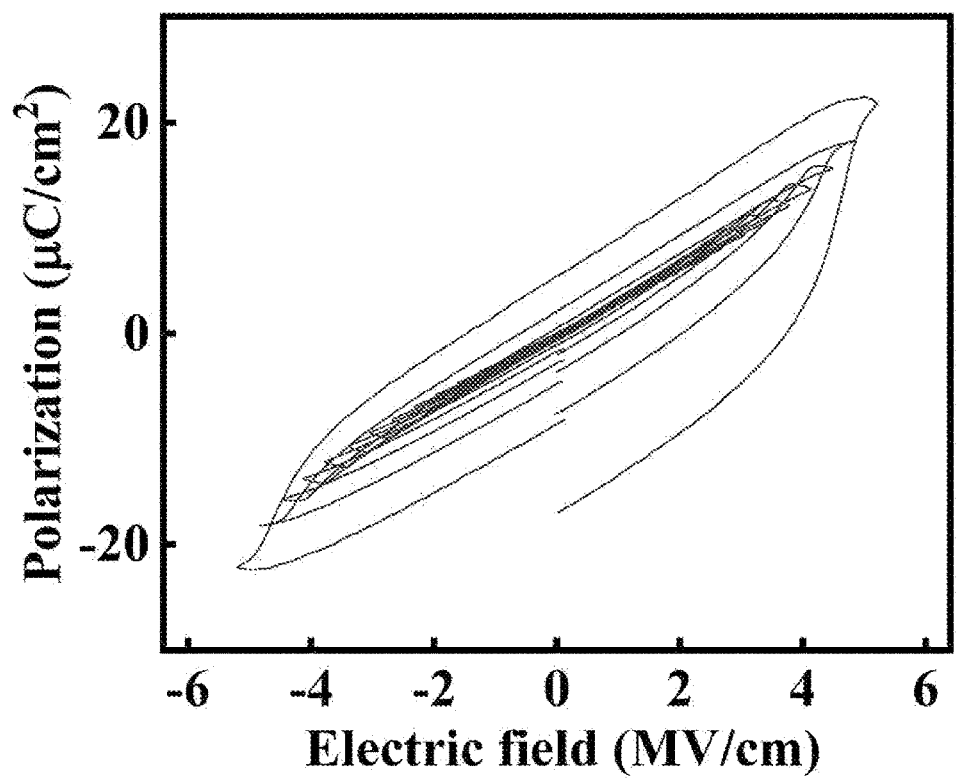
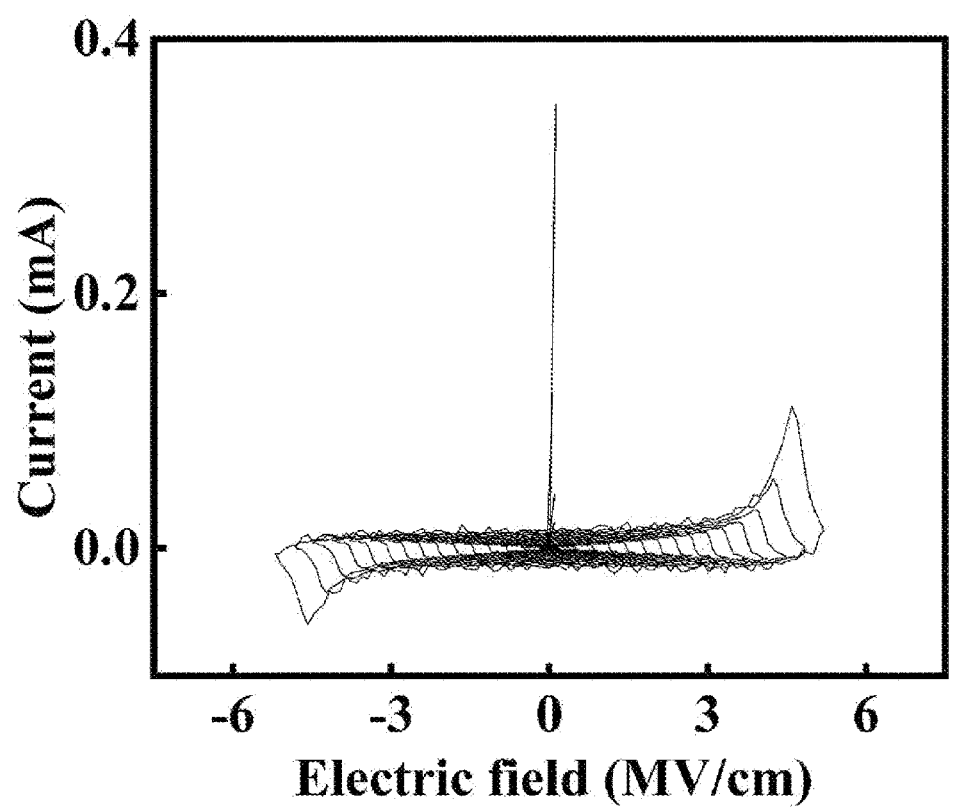
FIG. 34

| | FERROELECTRIC THIN FILM | FILM THICKNESS (nm) |
|---|---|---|
| EXAMPLE25 | $Al_{0.782}Sc_{0.218}N$ | 139 |
| EXAMPLE26 | $Al_{0.79}Sc_{0.21}N$ | 142 |
| EXAMPLE27 | $Al_{0.79}Sc_{0.21}N$ | 180 |

FIG. 35

| | MOLAR CONCENTRATION | | |
|---|---|---|---|
| | EXAMPLE25 | EXAMPLE26 | EXAMPLE27 |
| $N_2$ | 1.000 | 0.667 | 0.333 |
| Ar | 0.000 | 0.333 | 0.667 |

FIG. 36

FERROELECTRIC THIN FILM, ELECTRONIC ELEMENT USING NAME, AND METHOD FOR MANUFACTURING FERROELECTRIC THIN FILM

CROSS REFERENCE TO RELATED APPLICATIONS

The present application is a U.S. National Phase of International Application No. PCT/JP2020/048846 entitled "FERROELECTRIC THIN FILM, ELECTRONIC ELEMENT USING SAME, AND METHOD FOR MANUFACTURING FERROELECTRIC THIN FILM," and filed on Dec. 25, 2020. International Application No. PCT/JP2020/02204886 claims priority to Japanese Patent Application No. 2019-239114 filed on Dec. 27, 2019, Japanese Patent Application No. 2020-031428 filed on Feb. 27, 2020, and Japanese Patent Application No. 2020-140024 filed on Aug. 21, 2020. The entire contents of each of the above-listed applications are hereby incorporated by reference for all purposes.

TECHNICAL FIELD

The present invention relates to a ferroelectric thin film, an electronic device using the same, and a method for producing the ferroelectric thin film.

BACKGROUND AND SUMMARY

Already known ferroelectric materials are barium titanate ($BaTiO_3$), lead zirconate titanate ($Pb(Zr, Ti)O_3$), lead lanthanum zirconate titanate (($Pb$, $La$)($Zr$, $Ti$)$O_3$), bismuth ferrate ($BiFeO_3$), and the like. Ferroelectric bodies (ferroelectric thin films), a kind of dielectric body, refer to a substance in which electric dipoles are aligned in the absence of an external electric field and directions of the dipoles can vary depending on the electric field. Such ferroelectric bodies are a dielectric body having pyroelectric properties and piezoelectric properties in addition to ferroelectric properties. Thus, the ferroelectric bodies are used as a ferroelectric random access memory (FeRAM) or the like that uses ferroelectric properties, or as an actuator or the like that uses the piezoelectric effect.

Among ferroelectric materials, scandium-doped aluminum nitride having excellent ferroelectric properties has been recently reported (see Non-Patent Literature 1).

CITATION LIST

Non-Patent Literature

Non-Patent Literature 1: Simon Fichtner, Niklas Wolff, Fabian Lofink, Lorenz Kienle, and Bernhard Wagner, J. Appl. Phys. 125, 114103(2019)

Technical Problem

Non-Patent Literature 1 describes that when the concentration X of scandium (Sc) in Sc-doped aluminum nitride ($Al_{1-x}Sc_xN$) is lower than 0.22, dielectric breakdown occurs before an electric field reaches a coercive electric field.

Therefore, there is a problem in which a ferroelectric thin film cannot be formed from $Al_{1-x}Sc_xN$ having a Sc concentration X lower than 0.22.

A ferroelectric thin film including $Al_{1-x}Sc_xN$ has a problem in which when a sufficient thickness (for example, 600 nm or more) of the ferroelectric thin film is not available, the ferroelectric thin film exhibits insufficient ferroelectric properties and lacks stability when applied to practical use.

In view of the circumstances described above, it is an object of the present invention to provide a ferroelectric thin film having high ferroelectric properties and stability when applied to practical use, an electronic device using the same, and a method for producing the ferroelectric thin film.

Solution to Problem

The inventors of the present invention have intensively performed research and development on the aforementioned problems, and as a result found a ferroelectric thin film that is innovative as described below, an electronic device using the same, and a method for producing the ferroelectric thin film.

A first aspect of the present invention to solve the problems is a ferroelectric thin film represented by a chemical formula $M1_{1-x}M2_xN$, wherein M1 is at least one element selected from aluminum (Al) and gallium (Ga), M2 is at least one element selected from magnesium (Mg), scandium (Sc), ytterbium (Yb), and niobium (Nb), and X is within the range of 0 or more and 1 or less.

In the first aspect, the ferroelectric thin film that has high ferroelectric properties and high stability can be provided.

A second aspect of the present invention is the ferroelectric thin film according to the first aspect, wherein M1 is Al, M2 is Sc, and X is within the range of more than 0 and 0.219 or less.

In the second aspect, there can be provided the ferroelectric thin film that has much higher ferroelectric properties and higher stability than the ferroelectric thin film including $Al_{1-x}Sc_xN$ disclosed in Non-Patent Literature 1 although the Sc concentration is lower than the Sc concentration at which it is recognized that the thin film cannot be formed.

A third aspect of the present invention is the ferroelectric thin film according to the first aspect, wherein M1 is Al, M2 is Sc, and X is within the range of 0.065 or more and 0.219 or less.

In the third aspect, there can be provided the ferroelectric thin film that has much higher ferroelectric properties and higher stability than the ferroelectric thin film including $Al_{1-x}Sc_xN$ disclosed in Non-Patent Literature 1 although the Sc concentration is lower than the Sc concentration at which it is recognized that the thin film cannot be formed.

A fourth aspect of the present invention is the ferroelectric thin film according to the first aspect, wherein M1 is Al, M2 is Sc, and X is within the range of 0.16 or more and 0.219 or less.

In the fourth aspect, there can be provided the ferroelectric thin film that has much higher ferroelectric properties and higher stability than the ferroelectric thin film including $Al_{1-x}Sc_xN$ disclosed in Non-Patent Literature 1 although the Sc concentration is lower than the Sc concentration at which it is recognized that the thin film cannot be formed.

A fifth aspect of the present invention is the ferroelectric thin film according to the first aspect, wherein M1 is Al, M2 is $Mg_{1-y}Nb_y$, X is within the range of 0 or more and 1 or less, and Y is within the range of 0 or more and 1 or less.

In the fifth aspect, the ferroelectric thin film that is more inexpensive and have higher ferroelectric properties and higher stability can be provided.

A sixth aspect of the present invention is the ferroelectric thin film according to the first aspect, wherein M1 is Ga, M2 is Sc, and X is within the range of 0 or more and 1 or less.

In the sixth aspect, the ferroelectric thin film that has higher ferroelectric properties and higher stability can be provided. This aspect is highly applicable to current gallium nitride semiconductors and their production processes, and a production process of this aspect can easily be incorporated into the production processes for the current gallium nitride semiconductors.

A seventh aspect of the present invention is the ferroelectric thin film according to the first aspect, wherein M1 is Al, M2 is Yb, and X is within the range of 0 or more and 1 or less.

In the seventh aspect, the ferroelectric thin film that has higher ferroelectric properties and higher stability can be provided.

An eighth aspect of the present invention is the ferroelectric thin film according to the first aspect, wherein M1 is Ga, and X is 0.

In the eighth aspect, the ferroelectric thin film that has higher ferroelectric properties and higher stability can be provided. This aspect is highly applicable to the current gallium nitride semiconductors and their production processes, and a production process of this aspect can easily be incorporated into the production processes for the current gallium nitride semiconductors.

A ninth aspect of the present invention is the ferroelectric thin film according to any one of the first to eighth aspects, wherein u calculated by the following expression is within the range of 0.375 or more and less than 0.5.

$$u = \frac{1}{3}\frac{a^2}{c^2} + 0.25 \quad [\text{Expression 1}]$$

wherein a is an a-axis lattice constant in a crystal structure of the ferroelectric thin film, and c is a c-axis lattice constant.

In the ninth aspect, the ferroelectric thin film that has a higher remanent polarization value (Pr) can be provided.

A tenth aspect of the present invention is the ferroelectric thin film according to any one of the first to ninth aspects having a thickness of 1 nm to 300 nm.

In the tenth aspect, there can be provided the ferroelectric thin film that has sufficient ferroelectric properties and sufficiently high stability without deteriorating characteristics even when the film thickness is small as described above.

An eleventh aspect of the present invention is the ferroelectric thin film according to any one of the first to ninth aspects having a thickness of 1 nm to 200 nm.

In the eleventh aspect, there can be provided the ferroelectric thin film that has sufficient ferroelectric properties and sufficiently high stability without deteriorating characteristics even when the film thickness is smaller as described above.

A twelfth aspect of the present invention is the ferroelectric thin film according to any one of the first to ninth aspects having a thickness of 1 nm to 100 nm.

In the twelfth aspect, there can be provided the ferroelectric thin film that has sufficient ferroelectric properties and sufficiently high stability without deteriorating characteristics even when the film thickness is further smaller.

A thirteenth aspect of the present invention is the ferroelectric thin film according to any one of the first to ninth aspects having a thickness of 20 nm to 80 nm.

In the thirteenth aspect, there can be provided the ferroelectric thin film that has sufficient ferroelectric properties and sufficiently high stability without deteriorating characteristics even when the film thickness is small as described above.

A fourteenth aspect of the present invention is a ferroelectric thin film including the ferroelectric thin film according to any one of the first to thirteenth aspects which is provided on a low-heat resistant base material.

Herein, the low-heat resistant base material is not particularly limited as long as it is a base material having low heat resistance (a material having an upper limit of usable temperature of 50° C. to 700° C.). Examples of the low-heat resistant base material include soda-lime glass, organic base materials (polyethylene terephthalate (PET)), polyimide, and alkali-free glass.

In the fourteenth aspect, the ferroelectric thin film according to the present invention can be produced even when the heating temperature of a substrate (base material) is low (for example, 20° C. to 30° C.). Thus, a flexible device or a display memory, for example, can be produced with the use of the ferroelectric thin film according to the present invention.

A fifteenth aspect of the present invention is an electronic device using the ferroelectric thin film according to any one of the first to fourteenth aspects.

Here, the "electronic device" is a device including a ferroelectric nonvolatile memory (including an electric field effect ferroelectric nonvolatile memory), a resistance-variable nonvolatile memory, a piezoresistance transistor, an energy storage device, a piezoelectric device (piezoelectric element), a pyroelectric device, a piezoelectric sensor, and an electrocaloric effect device. For example, these electronic devices include a layered structure shown in FIG. 1. In FIG. 1, M is a metal (conductor), F is a ferroelectric body, S is a semiconductor, I is an insulator, and AF is an antiferroelectric body. As can be seen from FIG. 1, these electronic devices include a ferroelectric layer (F) that is formed on a metal (conductor) layer (M), a semiconductor layer (S), or an insulator layer (I).

In the fifteenth aspect, there can be provided the electronic device that is more compact and have higher performance than conventional electronic devices since the aforementioned ferroelectric thin film has very high ferroelectric properties and high stability.

A sixteenth aspect of the present invention is a method for producing the ferroelectric thin film according to any one of the first to fourteenth aspects by a sputtering method, wherein a sputtering gas contains at least nitrogen, a molar concentration of nitrogen contained in the sputtering gas is within the range of 0.667 to 1.0, and a pressure of the sputtering gas is 1 Pa or less.

Here, the "sputtering gas" refers to a gas used in the sputtering method. Examples of the sputtering gas include inert gases such as nitrogen ($N_2$) and argon (Ar).

According to the sixteenth aspect, a ferroelectric thin film having a high remanent polarization value can be produced without causing dielectric breakdown even when a high electric field is applied.

BRIEF DESCRIPTION OF THE FIGURES

FIG. 3 is a table showing components and production methods in Examples 1 to 5 and Comparative Examples.

FIG. 12 is a table showing components and film thickness in Examples 6 to 8.

FIG. 13 includes graphs showing a hysteresis curve (upper graph) and a relationship between an electric field strength and a current (lower graph) in Example 6.

FIG. 14 includes graphs showing a hysteresis curve (upper graph) and a relationship between an electric field strength and a current (lower graph) in Example 7.

FIG. 15 includes graphs showing a hysteresis curve (upper graph) and a relationship between an electric field strength and a current (lower graph) in Example 8.

FIG. 17 is a table showing Examples 9 to 13 and structures of thin films in Examples 9 to 13.

FIG. 18 includes graphs showing a hysteresis curve (upper graph) and a relationship between an electric field strength and a current (lower graph) in Example 9.

FIG. 22 includes graphs showing a hysteresis curve (upper graph) and a relationship between an electric field strength and a current (lower graph) in Example 13.

FIG. 23 is a table showing Examples 14 to 24 and structures of thin films in Examples 14 to 24.

FIG. 25 includes graphs showing a hysteresis curve (upper graph) and a relationship between an electric field strength and a current (lower graph) in Example 15.

FIG. 26 includes graphs showing a hysteresis curve (upper graph) and a relationship between an electric field strength and a current (lower graph) in Example 16.

FIG. 27 includes graphs showing a hysteresis curve (upper graph) and a relationship between an electric field strength and a current (lower graph) in Example 17.

FIG. 28 includes graphs showing a hysteresis curve (upper graph) and a relationship between an electric field strength and a current (lower graph) in Example 18.

FIG. 29 includes graphs showing a hysteresis curve (upper graph) and a relationship between an electric field strength and a current (lower graph) in Example 19.

FIG. 30 includes graphs showing a hysteresis curve (upper graph) and a relationship between an electric field strength and a current (lower graph) in Example 20.

FIG. 31 includes graphs showing a hysteresis curve (upper graph) and a relationship between an electric field strength and a current (lower graph) in Example 21.

FIG. 32 includes graphs showing a hysteresis curve (upper graph) and a relationship between an electric field strength and a current (lower graph) in Example 22.

FIG. 33 includes graphs showing a hysteresis curve (upper graph) and a relationship between an electric field strength and a current (lower graph) in Example 23.

FIG. 34 includes graphs showing a hysteresis curve (upper graph) and a relationship between an electric field strength and a current (lower graph) in Example 24.

FIG. 35 is a table showing structures in Examples 25 to 27.

FIG. 36 is a table showing the molar concentration of each gas contained in sputtering gases used during production of Examples 25 to 27.

DETAILED DESCRIPTION

Hereinafter, embodiments of a ferroelectric thin film according to the present invention will be described with reference to the accompanying drawings. The present invention is not limited to the following embodiments.

First Embodiment

Figure 1:
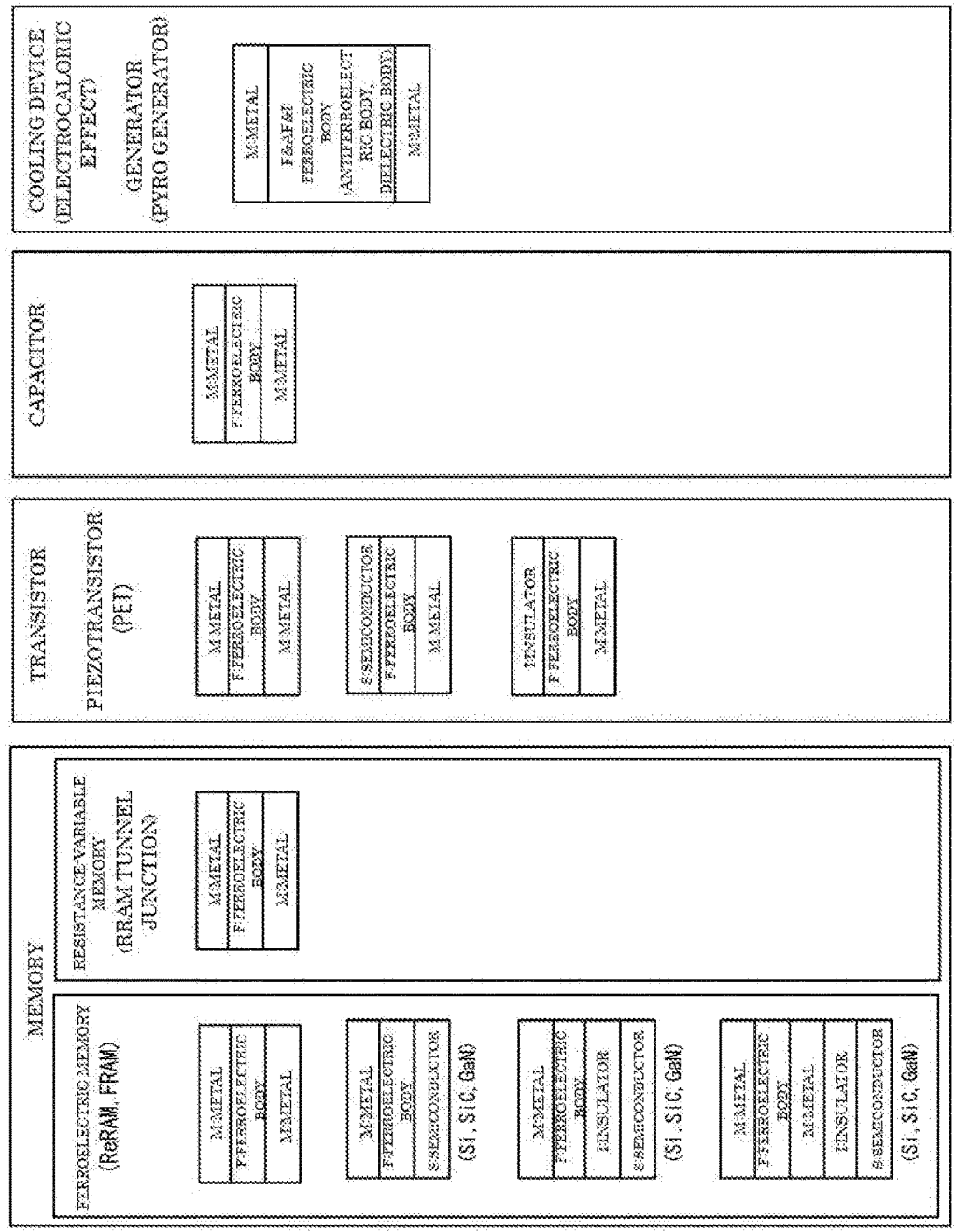
FIG. 1 is a conceptual side view of a layered structure of an electronic device according to the present invention as an example.
Figure 2:
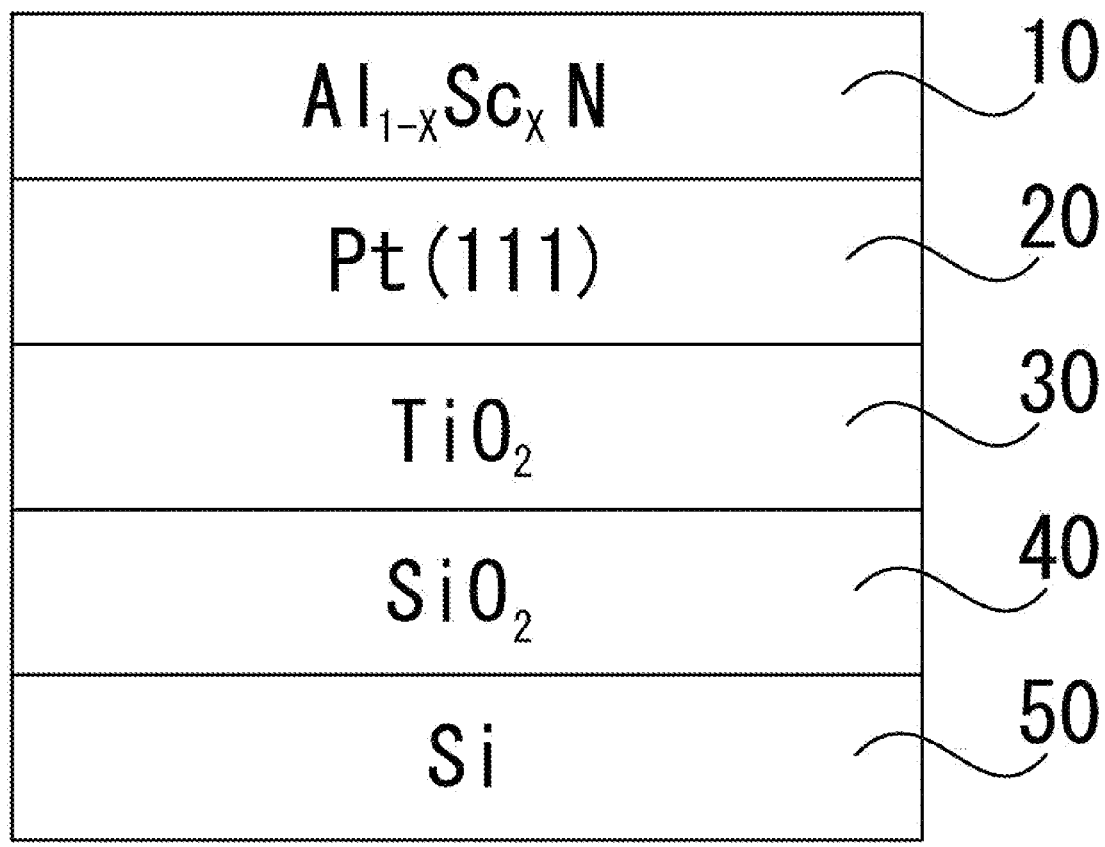
FIG. 2 is a schematic side view of a ferroelectric thin film according to a first embodiment.
Figure 4:
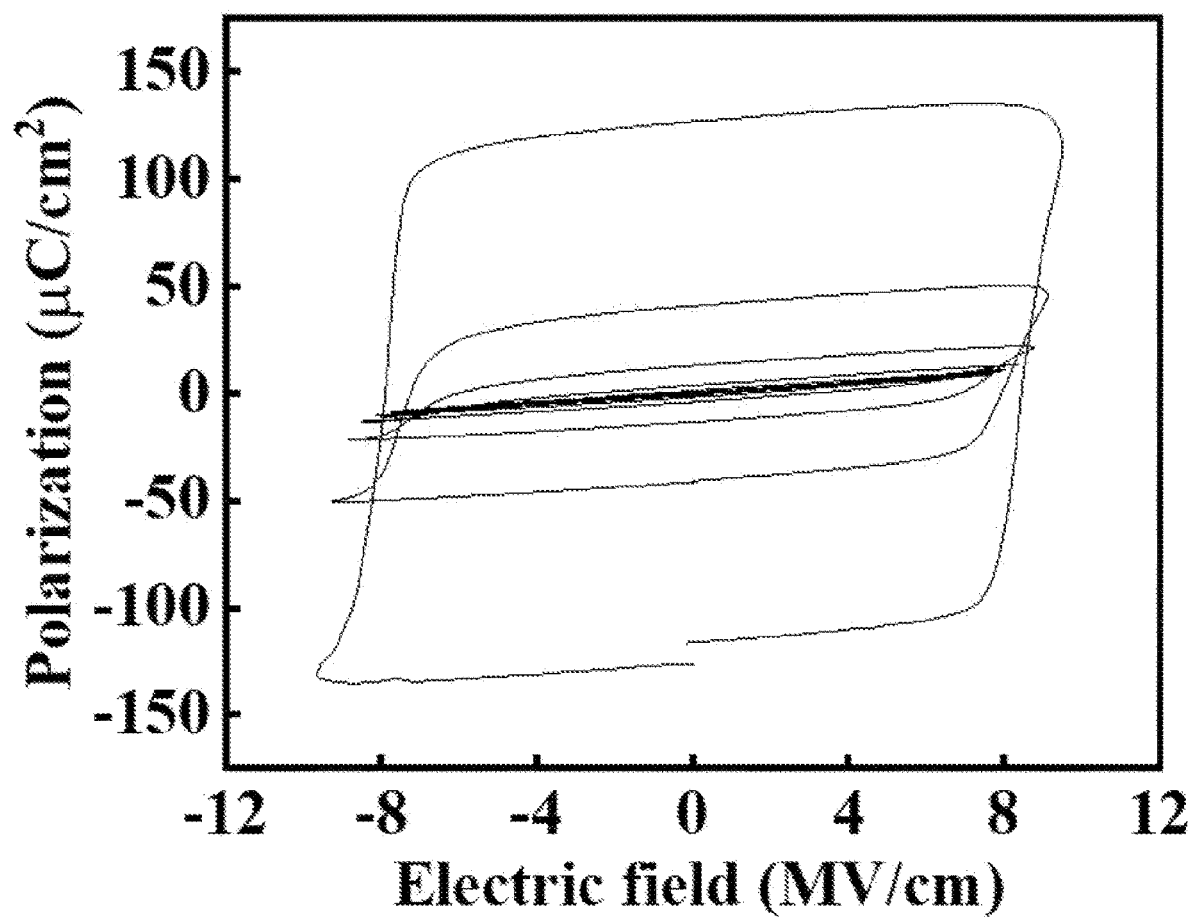
FIG. 4 is a graph showing a hysteresis curve in Example 1.
Figure 5:
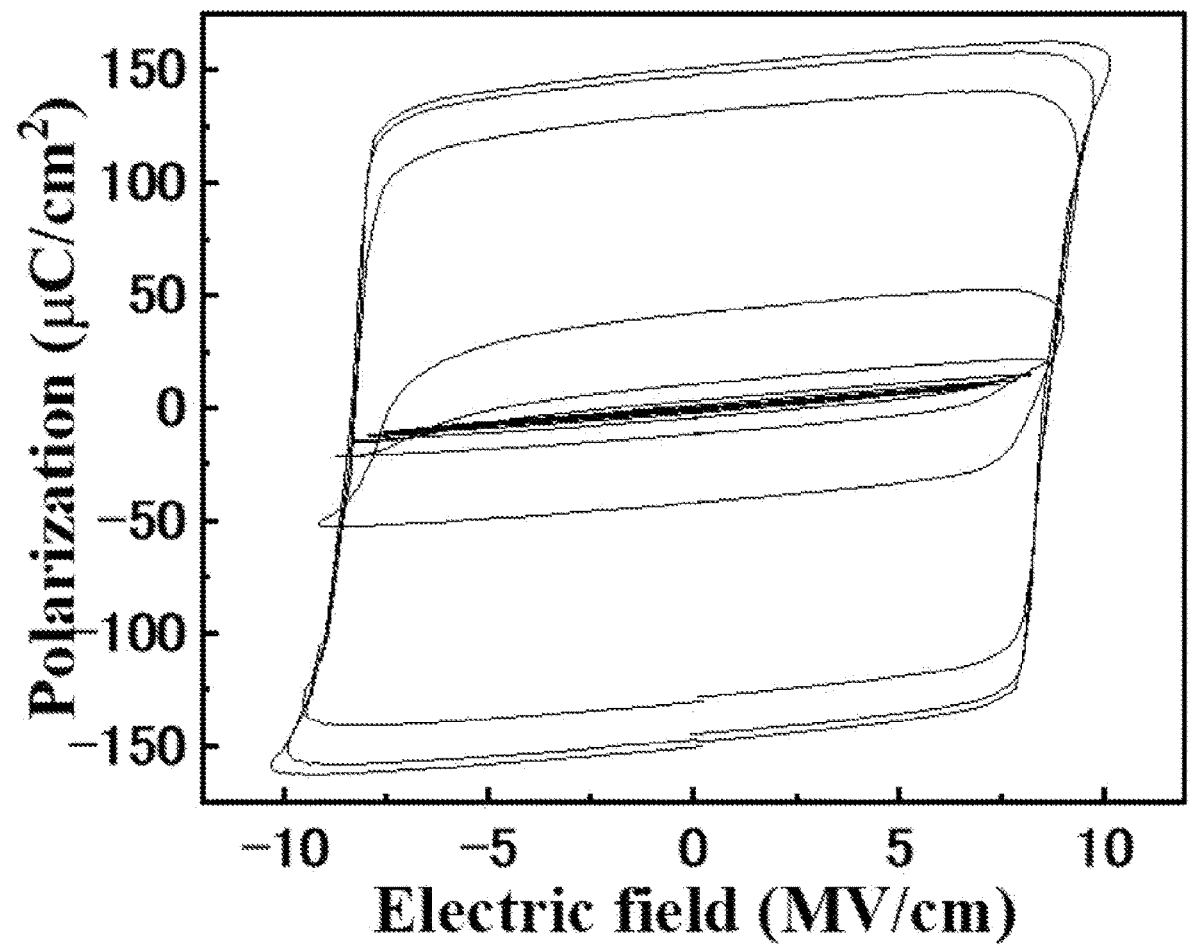
FIG. 5 is a graph showing a hysteresis curve in Example 2.
Figure 6:
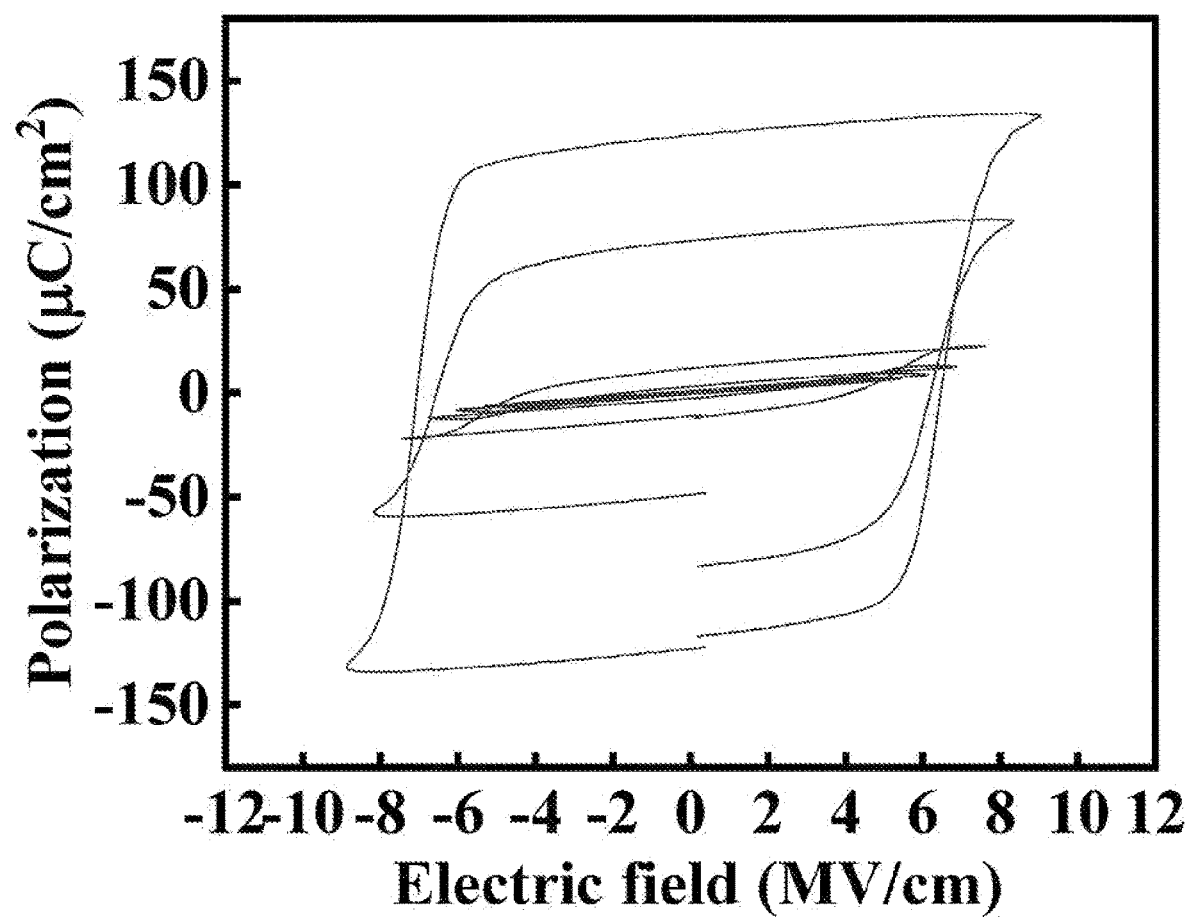
FIG. 6 is a graph showing a hysteresis curve in Example 3.
Figure 7:
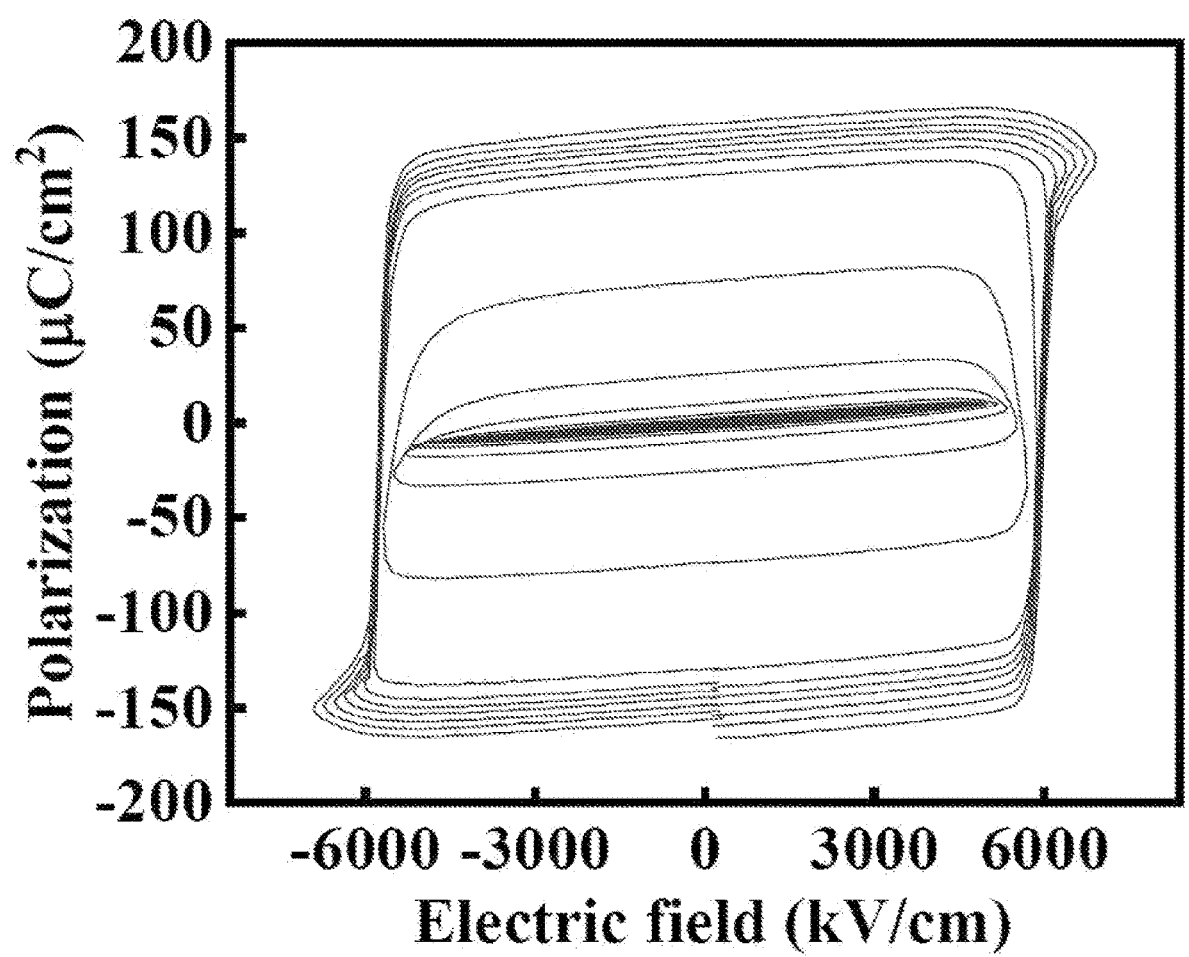
FIG. 7 is a graph showing a hysteresis curve in Example 4.
Figure 8:
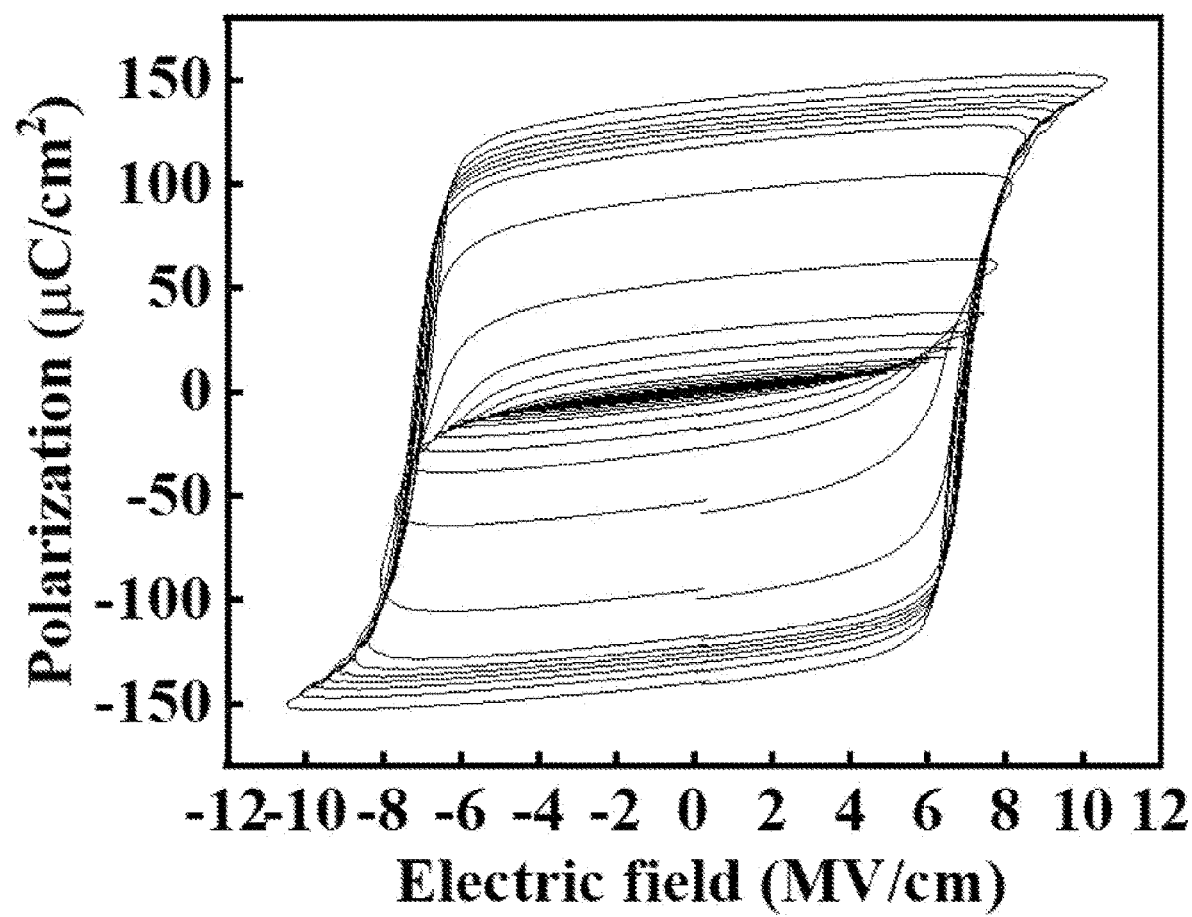
FIG. 8 is a graph showing a hysteresis curve in Example 5.

FIG. 2 is a schematic side view of a ferroelectric thin film according to a first embodiment. As shown in FIG. 2, a ferroelectric thin film 10 is formed on a thin film composed of three layers, a silicon dioxide layer ($SiO_2$ layer) 40, a titanium dioxide layer ($TiO_2$ layer) 30, and a platinum (111) layer (Pt(111) layer) 20 laminated in this order from the bottom to the top on a silicon substrate (Si substrate) 50. Herein, the Pt(111) layer refers to a platinum layer having a Miller index of (111).

The Si substrate 50 is not particularly limited, and a commercially available Si substrate can be used. The thickness of the Si substrate is not particularly limited.

The $SiO_2$ layer 40 is also not particularly limited as long as it can be formed by sputtering or the like. The thickness of the $SiO_2$ layer is not particularly limited as long as it is within the range of 10 nm to 2,000 nm.

The $TiO_2$ layer 30 is also not particularly limited as long as it can be formed by sputtering or the like. The thickness of the $TiO_2$ layer is not particularly limited as long as it is within the range of 2 nm to 100 nm. Instead of the $TiO_2$ layer, a tantalum layer, a tantalum oxide layer, a niobium layer, a niobium oxide layer, or the like may be used.

The Pt(111) layer 20 is also not particularly limited as long as it can be formed by sputtering or the like. The thickness of the Pt(111) layer is not particularly limited as long as it is within the range of 20 nm to 200 nm.

The ferroelectric thin film 10 formed on the Pt(111) layer 20 includes scandium(Sc)-doped aluminum nitride represented by the chemical formula of $Al_{1-x}Sc_xN$. Herein, X is a Sc concentration. The ferroelectric thin film 10 has X that is within the range higher than 0 and 0.219 or lower.

The Sc concentration X of the ferroelectric thin film 10 is lower than the Sc concentration at which it is recognized that the thin film cannot be formed. However, the ferroelectric thin film 10 has much higher ferroelectric properties and higher stability than the ferroelectric thin film including $Al_{1-x}Sc_xN$ disclosed in Non-Patent Literature 1.

Herein, the thickness of the ferroelectric thin film 10 is not particularly limited, and is preferably within the range of 1 nm to 300 nm. The ferroelectric thin film 10 has sufficient ferroelectric properties and sufficiently high stability even when it is as thin as described above.

The thickness of the ferroelectric thin film 10 is more preferably within the range of 1 nm to 200 nm. The ferroelectric thin film 10 has sufficient ferroelectric properties and sufficiently high stability even when it is as thin as described above.

The thickness of the ferroelectric thin film 10 is further preferably within the range of 1 nm to 100 nm. The ferroelectric thin film 10 has sufficient ferroelectric properties and sufficiently high stability even when it is as thin as described above.

The thickness of the ferroelectric thin film 10 is particularly preferably within the range of 20 nm to 80 nm. The ferroelectric thin film 10 has sufficient ferroelectric properties and sufficiently high stability even when it is as thin as described above.

An electronic device using the ferroelectric thin film 10 has sufficient ferroelectric properties and sufficiently high stability, and thus the electronic device is more compact and has higher performance than conventional electronic devices. The configuration of such an electronic device is not particularly limited, and the electronic device can be produced by a known technique.

Next, a method for producing the ferroelectric thin film 10 according to the present embodiment (production method 1) will be described. As described above, the ferroelectric thin film 10 is formed on a thin film composed of three layers, the $SiO_2$ layer 40, the $TiO_2$ layer 30, and the Pt(111) layer 20 laminated in this order from the bottom to the top, on the Si substrate 50.

The $SiO_2$ layer 40 is first formed on the Si substrate 50. A method for forming the $SiO_2$ layer 40 is not particularly limited. The $SiO_2$ layer 40 can be produced by a known technique such as a sputtering method, a physical vapor deposition method (PVD method), a chemical vapor deposition method (CVD method), a molecular beam epitaxy method (MBE method), a pulsed laser deposition method (PLD method), or an oxidation method (thermal oxidation, steam oxidation, etc.).

Subsequently, the $TiO_2$ layer 30 is formed on the $SiO_2$ layer 40. A method for forming the $TiO_2$ layer 30 is not particularly limited. The $TiO_2$ layer 30 can be produced by a known technique such as a sputtering method, a physical vapor deposition method (PVD method), a chemical vapor deposition method (CVD method), a molecular beam epitaxy method (MBE method), a pulsed laser deposition method (PLD method), or an oxidation method (thermal oxidation, steam oxidation, etc.).

The Pt(111) layer 20 is then formed on the formed $TiO_2$ layer 30. A method for forming the Pt(111) layer 20 is not particularly limited. The Pt(111) layer 20 can be produced by a known technique such as a sputtering method, a physical vapor deposition method (PVD method), or a chemical vapor deposition method (CVD method).

The ferroelectric thin film 10 represented by the chemical formula $Al_{1-x}Sc_xN$ is formed on the formed Pt(111) layer 20. The ferroelectric thin film 10 can be formed by a general sputtering method, a physical vapor deposition method (PVD method), a chemical vapor deposition method (CVD method), a molecular beam epitaxy method (MBE method), a pulsed laser deposition method (PLD method), or the like. Specifically, the ferroelectric thin film 10 can be produced on the Pt(111) layer 20 by simultaneously sputtering a Sc target and an Al target in a nitrogen gas ($N_2$) atmosphere or a mixed atmosphere of $N_2$ and argon gas (Ar) (the gas pressure may be 1 Pa or less, and preferably between 0.267 Pa and 6.67 Pa). As the targets, an alloy containing Sc and Al at a predetermined ratio may be used. A compound containing Sc, Al, and N at a predetermined ratio, such as AlN, ScN, or AlScN, may be used.

Alternatively, similarly to a general piezoelectric thin film, the ferroelectric thin film 10 according to the present embodiment can be formed directly on the Si substrate by a production method such as a sputtering method or deposition (production method 2) as follows.

Specifically, the ferroelectric thin film 10 can be produced on the substrate (for example, a silicon (Si) substrate) by simultaneously sputtering a Sc target and an Al target in a $N_2$ atmosphere or a mixed atmosphere of $N_2$ and Ar (the gas pressure may be 1 Pa or less, and preferably between 0.10 Pa and 0.70 Pa). As the targets, an alloy containing Sc and Al at a predetermined ratio may be used.

Examples 1 to 5 and Comparative Examples 1 to 10

The following sputtering targets and the like were used for a sputtering apparatus. On an n-type Si substrate having a specific resistance of 0.02 Ωcm, a $SiO_2$ layer having a thickness of 50 nm to 200 nm, a $TiO_2$ layer having a thickness of 5 nm to 50 nm, a Pt(111) layer having a thickness of 50 nm to 200 nm, and a ferroelectric thin film having a thickness of 123 nm to 251 nm were produced multiple times by the aforementioned production method 1. The ferroelectric thin films each had different Sc concentrations X.

Sc sputtering target material (concentration: 99.99%)
Al sputtering target material (concentration: 99.999%)
Sputtering gas: $N_2$ (purity: 99.99995% or more)
Substrate heating temperature: 400° C. to 500° C.

On an n-type Si substrate having a specific resistance of 0.02 Ωcm, a ferroelectric thin film having a thickness of 290 nm to 460 nm was produced multiple times by the aforementioned production method 2. The ferroelectric thin films each had different Sc concentrations X.

Sputtering apparatus: BC3263 (manufactured by ULVAC)
Sc sputtering target material (concentration: 99.99%)
Al sputtering target material (concentration: 99.999%)
Sputtering gas: mixed gas of $N_2$ (purity: 99.99995% or more) and Ar (purity: 99.9999% or more) (mixing ratio: 40:60)
Substrate heating temperature: 300° C. to 600° C.

Before the film forming experiments described above, the air pressure inside the sputtering chamber was reduced to a high vacuum of 10-6 Pa or lower using a vacuum pump. Furthermore, a target surface was subjected to a cleaning treatment immediately after installation of the targets and immediately before each film forming experiment to prevent contamination by impurities such as oxygen.

A Pt electrode was provided on each of the ferroelectric thin films. Electric field-polarization characteristics of the respective ferroelectric thin films shown in FIG. 3 were measured using FCE-1/1A (manufactured by TOYO Corporation).

FIGS. 4 to 8 illustrate the measurement results. As can be seen from FIGS. 4 to 8, the ferroelectric thin films in Examples 1 to 5 exhibit a clear hysteresis curve.

The ferroelectric thin films in Examples 1 to 3 and 5, and Comparative Examples 6 and 7 were each subjected to measurement by a Positive-Up-Negative-Down (PUND) method. In the PUND method, a negative electric field waveform was applied once, a positive electric field waveform was applied twice, and a negative electric field waveform was then applied twice to the ferroelectric thin films in Examples 1 to 3 and 5, and Comparative Examples 6 and 7 to measure a polarization reversal.

Figure 9:
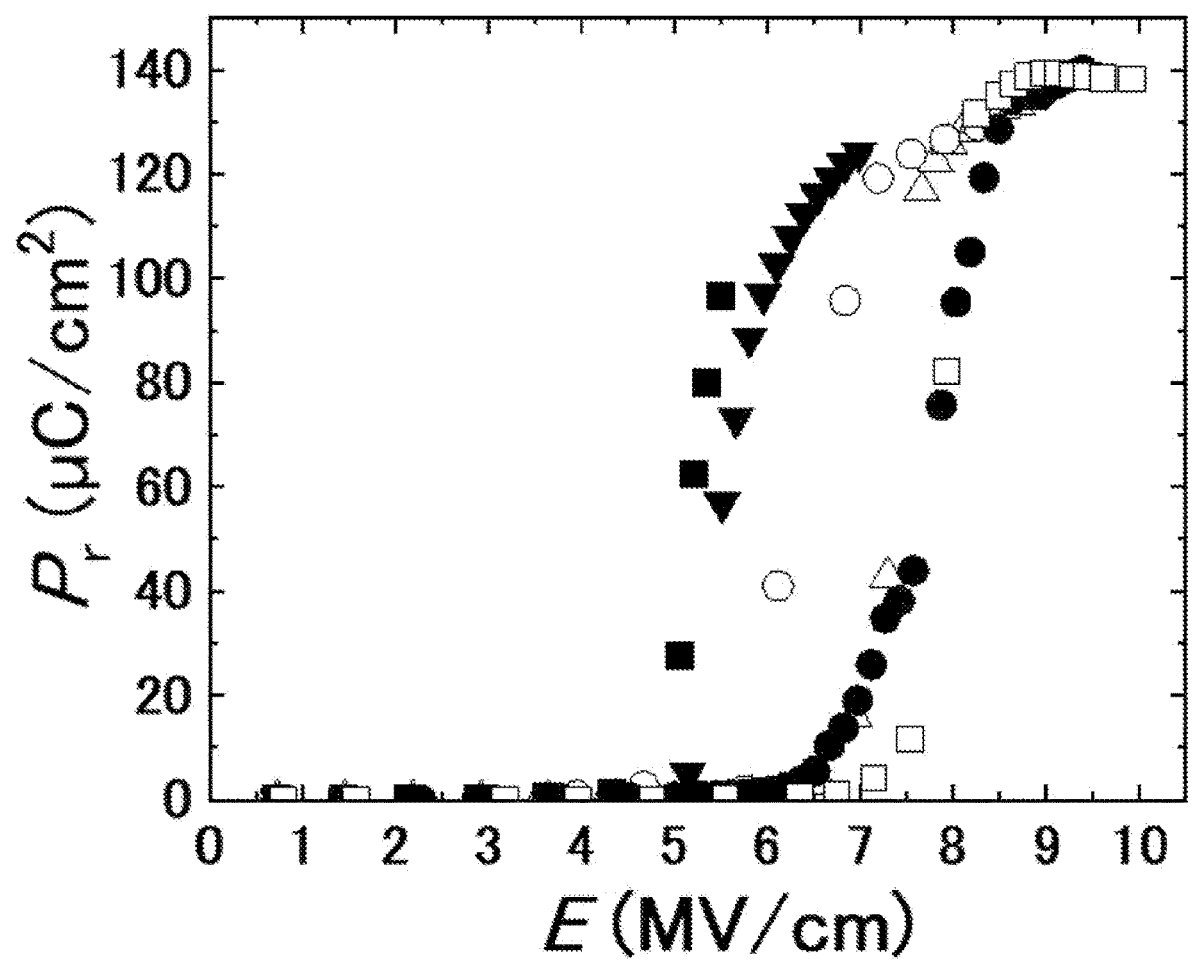
FIG. 9 is a graph showing results of PUND measurement in Examples 1 to 3 and 5, and Comparative Examples 6 and 7.

FIG. 9 illustrates the result. In FIG. 9, a black filled circle represents Example 1, an open square represents Example 2, an open triangle represents Example 3, an open circle represents Example 5, a black filled inverted triangle represents Comparative Example 6, and a black filled square represents Comparative Example 7. As can be seen from FIG. 9, a lower Sc concentration exhibits a higher remanent polarization value (Pr).

Figure 10:
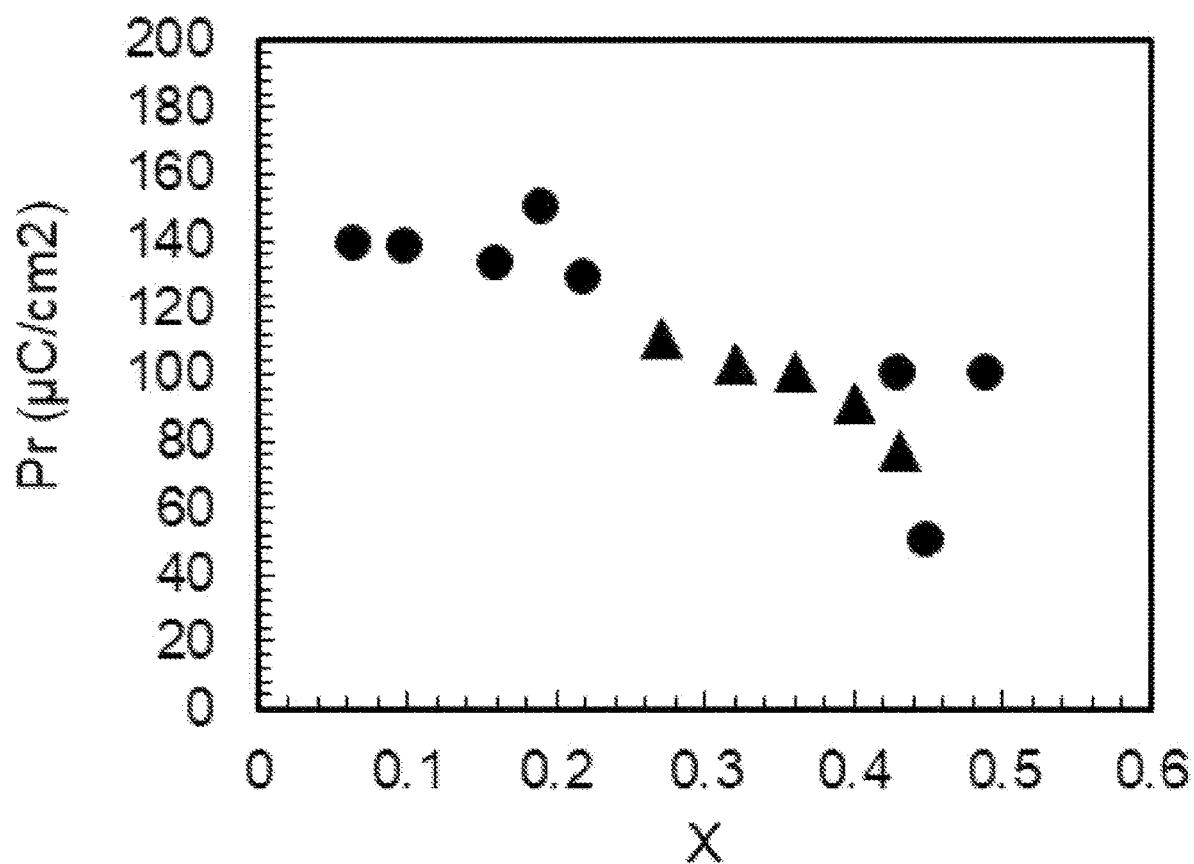
FIG. 10 is a graph showing a relationship between a concentration X of Sc and a remanent polarization value (Pr) in Examples and Comparative Examples.

FIG. 10 is a graph showing the relationship between the Sc concentration X and Pr of the ferroelectric thin films. Herein, data represented by black filled circles indicate data of the ferroelectric thin films produced by the production method 1 or 2, and data represented by black filled triangles indicate numerical values described in Non-Patent Literature 1.

As can be seen from what is illustrated in FIG. 9, the remanent polarization values (Pr) of the ferroelectric thin films (Examples 1 to 5) having a Sc concentration of 0.065 or more and 0.219 or less are higher than those of the ferroelectric thin films (Comparative Examples 1 to 8) having a Sc concentration between 0.27 and 0.49.

In other words, aluminum nitride ($Al_{1-x}Sc_xN$) having a doped Sc concentration X of 0.065 or more and 0.219 or less has a higher remanent polarization value (Pr) than aluminum nitride having a doped Sc concentration X between 0.27 and 0.49.

Figure 11:
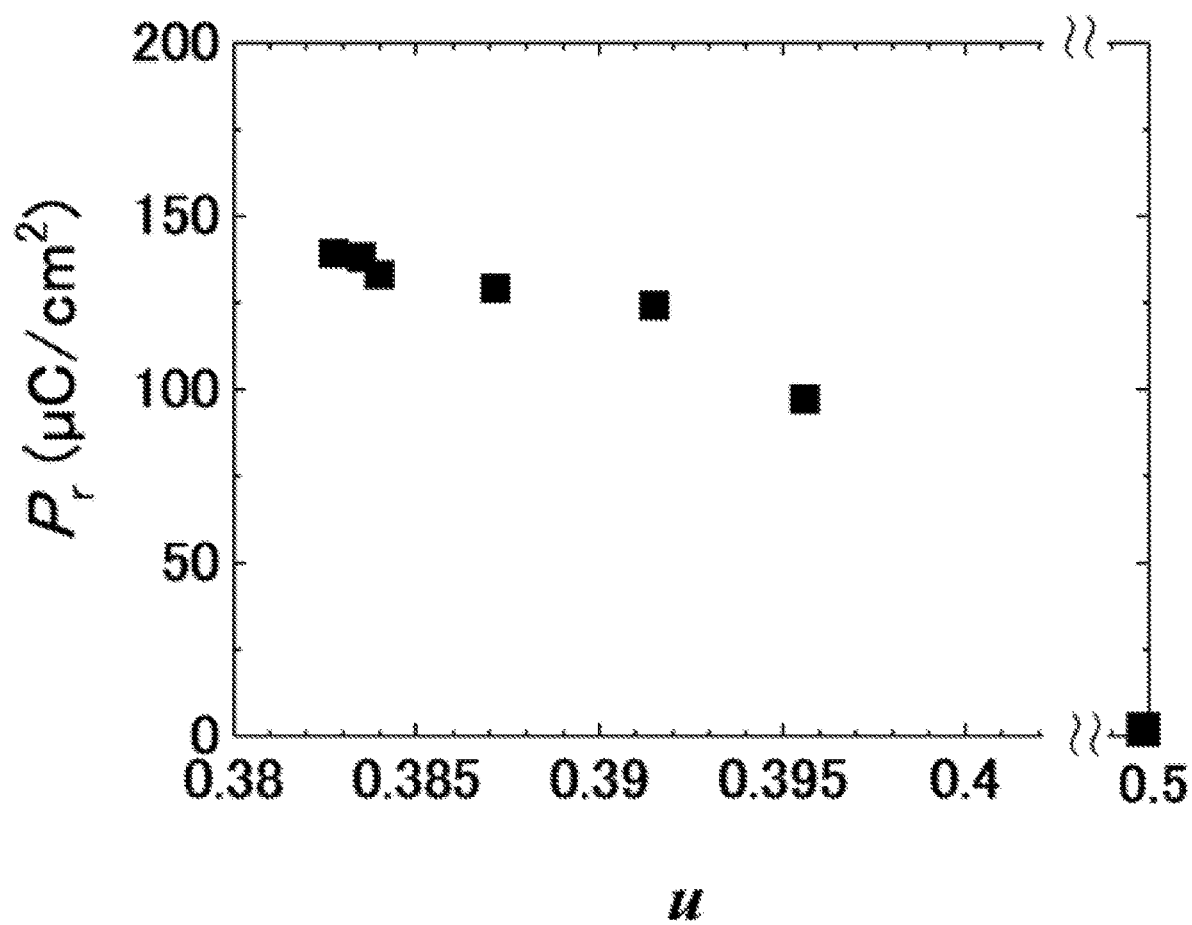
FIG. 11 is a graph showing a relationship between u and Pr.

Furthermore, FIG. 11 is a graph showing the relationship between u and Pr for a section of each of the ferroelectric thin films shown in FIG. 3. Herein, u refers to a ratio between a lattice constant in a polarization direction and the average distance between nitrogen atoms and metal atoms such as Al. When a crystal structure is, for example, a wurtzite structure, u can be generally calculated from the following expression.

$$u = \frac{1}{3}\frac{a^2}{c^2} + 0.25 \qquad \text{[Expression 2]}$$

In this expression, a is an a-axis lattice constant, and c is a c-axis lattice constant. Note that u, which is related to the distance between electric dipoles may strongly affect ferroelectric characteristics such as a polarization value.

As can be seen from this graph, the ferroelectric thin film having u of 0.375 or more and less than 0.5 has a high remanent polarization value (Pr) as described above.

The ferroelectric thin film having u of 0.375 or more and less than 0.5 has a high remanent polarization value regardless of its crystal structure. The ferroelectric thin film having u of 0.382 or more and 0.5 or less is more preferable since a high Pr is surely achieved. The ferroelectric thin film having u of 0.383 or more and 0.396 or less is further preferable since a high Pr is more surely achieved. The ferroelectric thin film having u of 0.383 or more and 0.387 or less is particularly preferable since a high Pr is further surely achieved. All the ferroelectric thin films in the present invention satisfy these relationships.

Examples 6 to 8

In order to confirm that the ferroelectric thin film having a small thickness according to the embodiment has sufficient ferroelectric properties, ferroelectric thin films each having a smaller thickness were produced using the aforementioned production method 2. A Pt electrode was provided on each of the ferroelectric thin films. A hysteresis curve and a current relative to an electric field strength of the respective ferroelectric thin films shown in FIG. 12 were each measured using FCE-1/1A (manufactured by TOYO Corporation).

The upper graphs of FIGS. 13 to 15 show hysteresis curves of the respective ferroelectric thin films, and the lower graphs of FIGS. 13 to 15 show the current graphs relative to the electric field strength. As can be seen from FIGS. 13 to 15, the ferroelectric thin films in Examples 6 to 8 have ferroelectric properties.

Second Embodiment

In the first embodiment, the ferroelectric thin films were produced using a process at higher temperatures. However, the present invention is not limited to the embodiment. For example, the ferroelectric thin film according to the present invention can be produced even when the heating temperature of a substrate (base material) in the aforementioned production methods is low (for example, in the range of 20° C. to 30° C.).

Therefore, the ferroelectric thin film according to the present invention can be formed on a low-heat resistant base material which is a base material having low heat resistance. Thus, the ferroelectric thin film according to the present invention can be used in an electronic device having low heat resistance. Examples of the low-heat resistant base material include soda-lime glass, organic base materials (polyethylene terephthalate (PET)), polyimide, and alkali-free glass.

Examples 9 to 13

Figure 16:
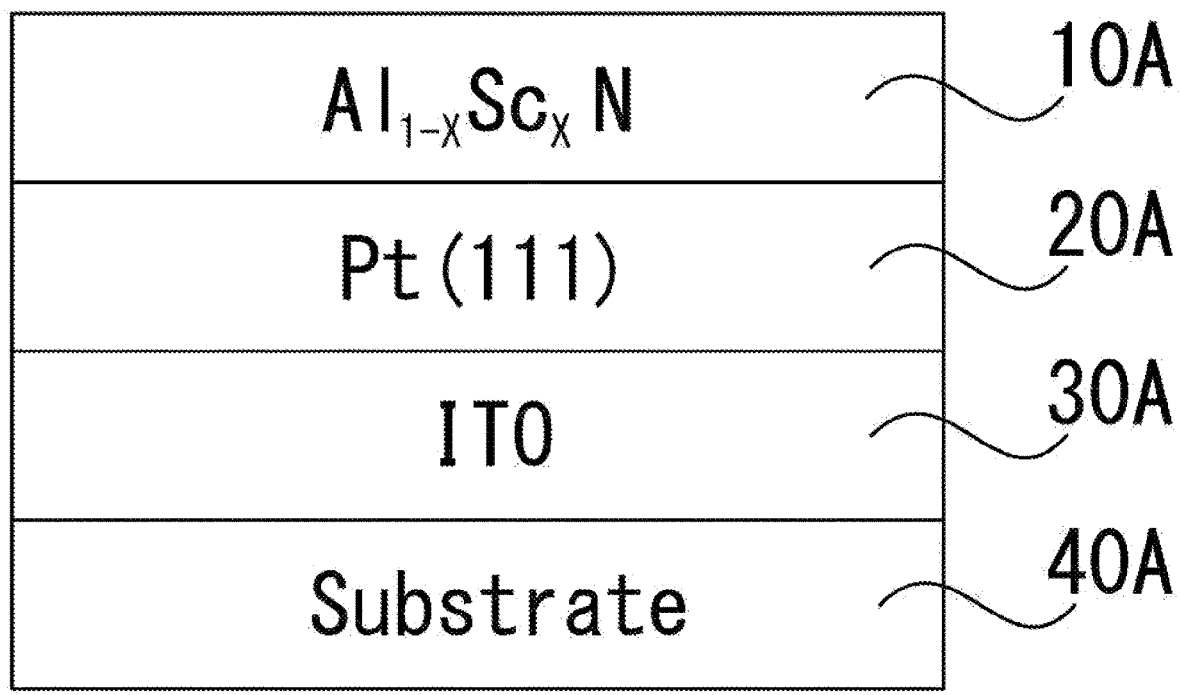
FIG. 16 is a schematic side view of a ferroelectric thin film according to a second embodiment.
Figure 19:
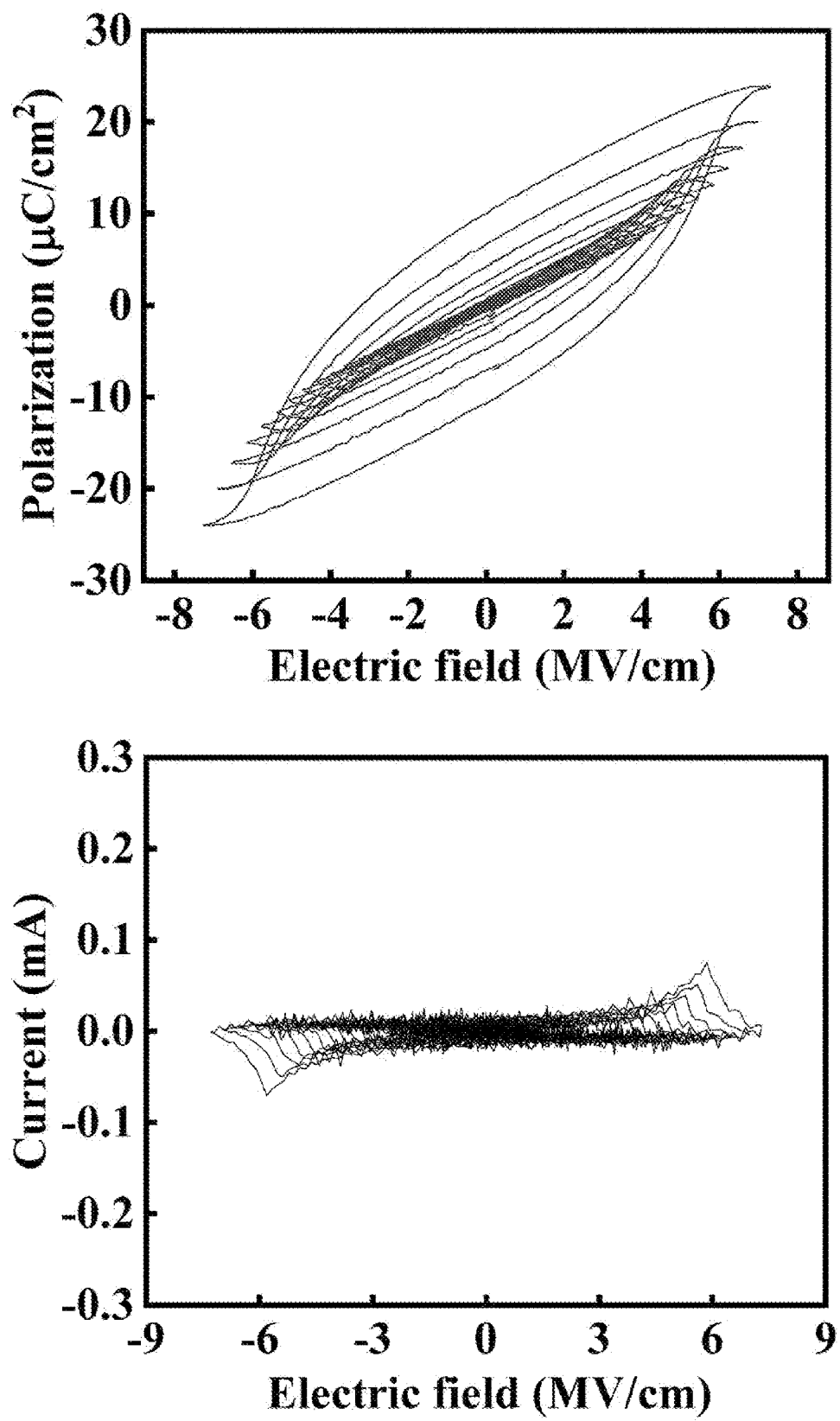
FIG. 19 includes graphs showing a hysteresis curve (upper graph) and a relationship between an electric field strength and a current (lower graph) in Example 10.
Figure 20:
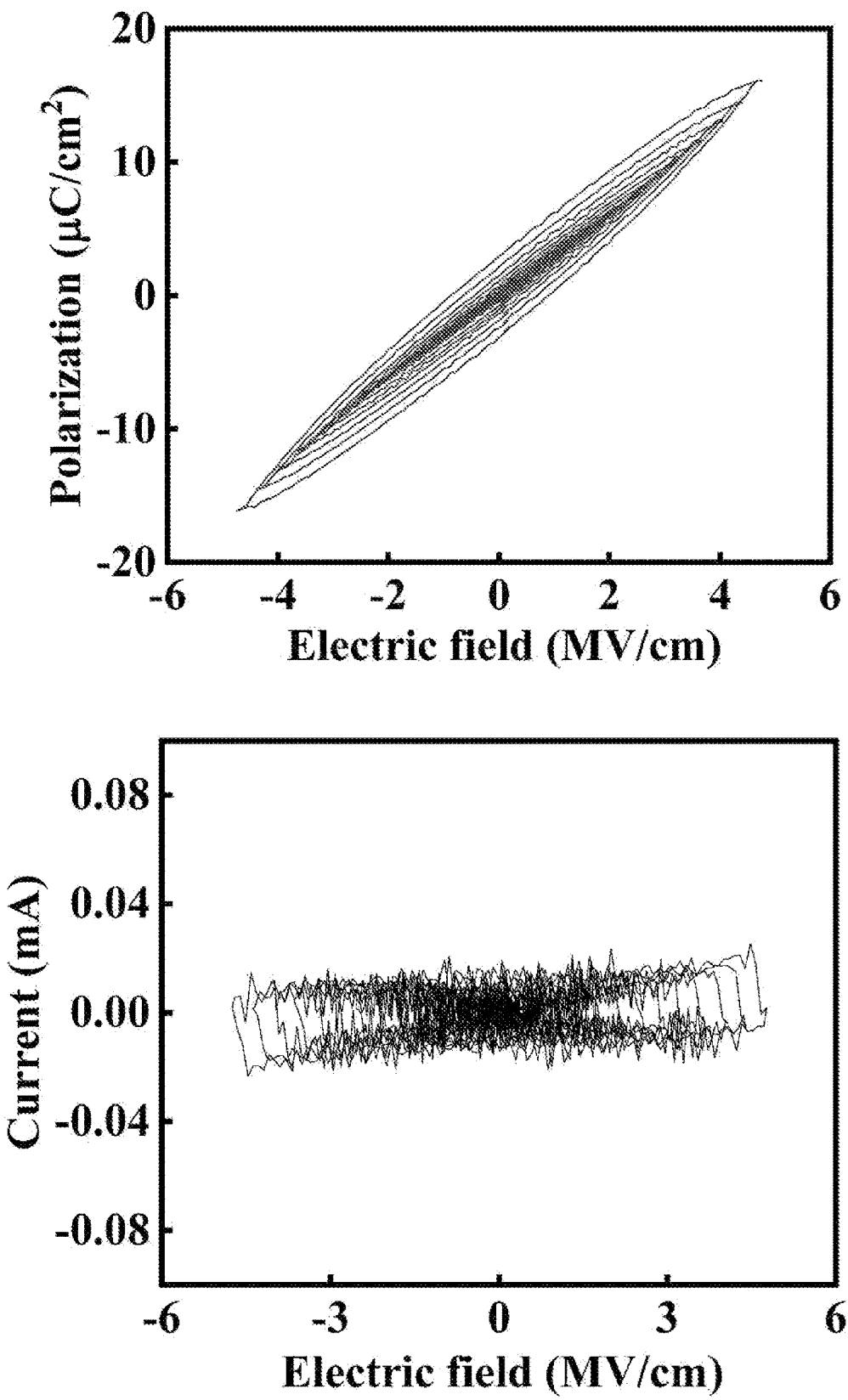
FIG. 20 includes graphs showing a hysteresis curve (upper graph) and a relationship between an electric field strength and a current (lower graph) in Example 11.
Figure 21:
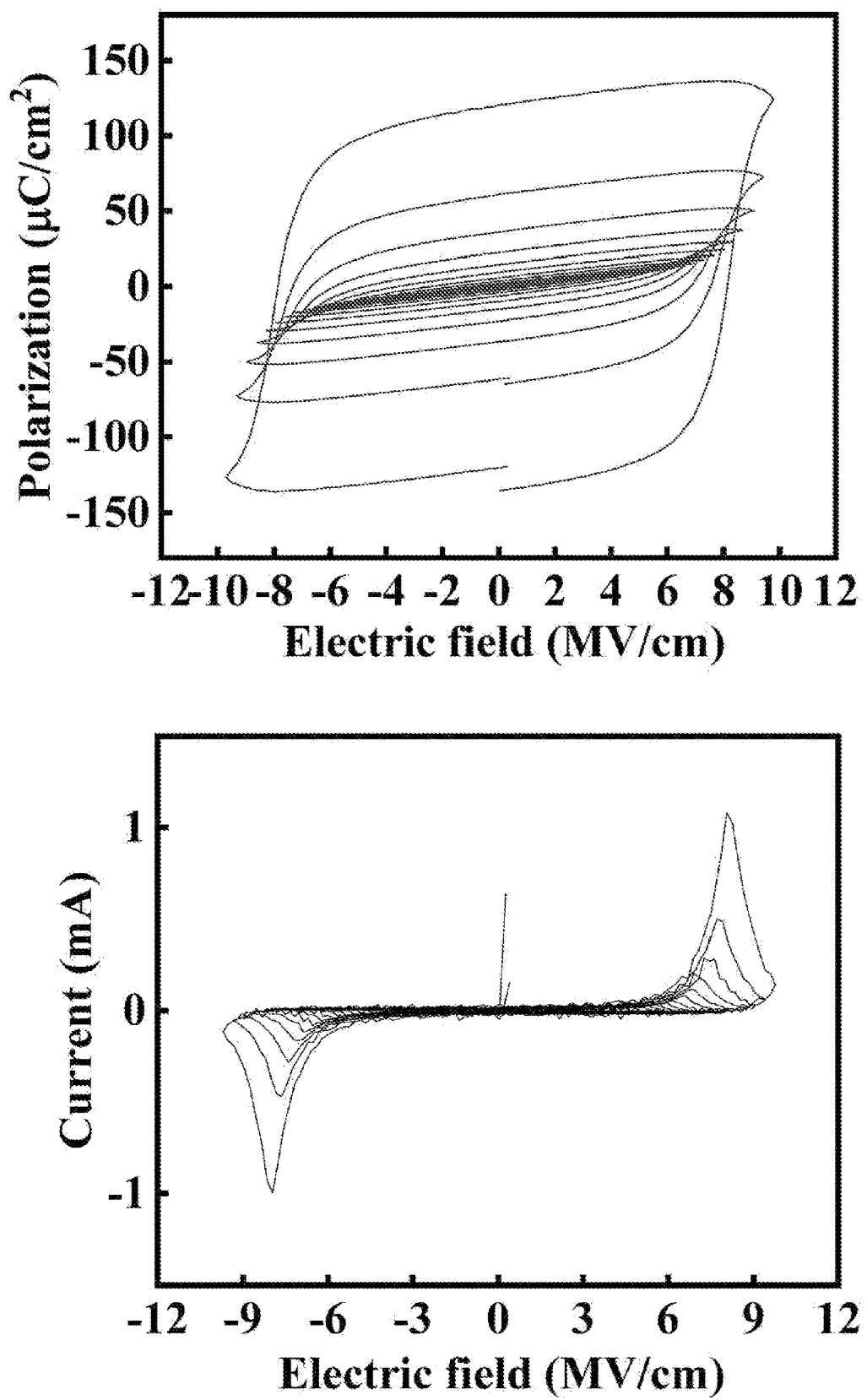
FIG. 21 includes graphs showing a hysteresis curve (upper graph) and a relationship between an electric field strength and a current (lower graph) in Example 12.
Figure 24:
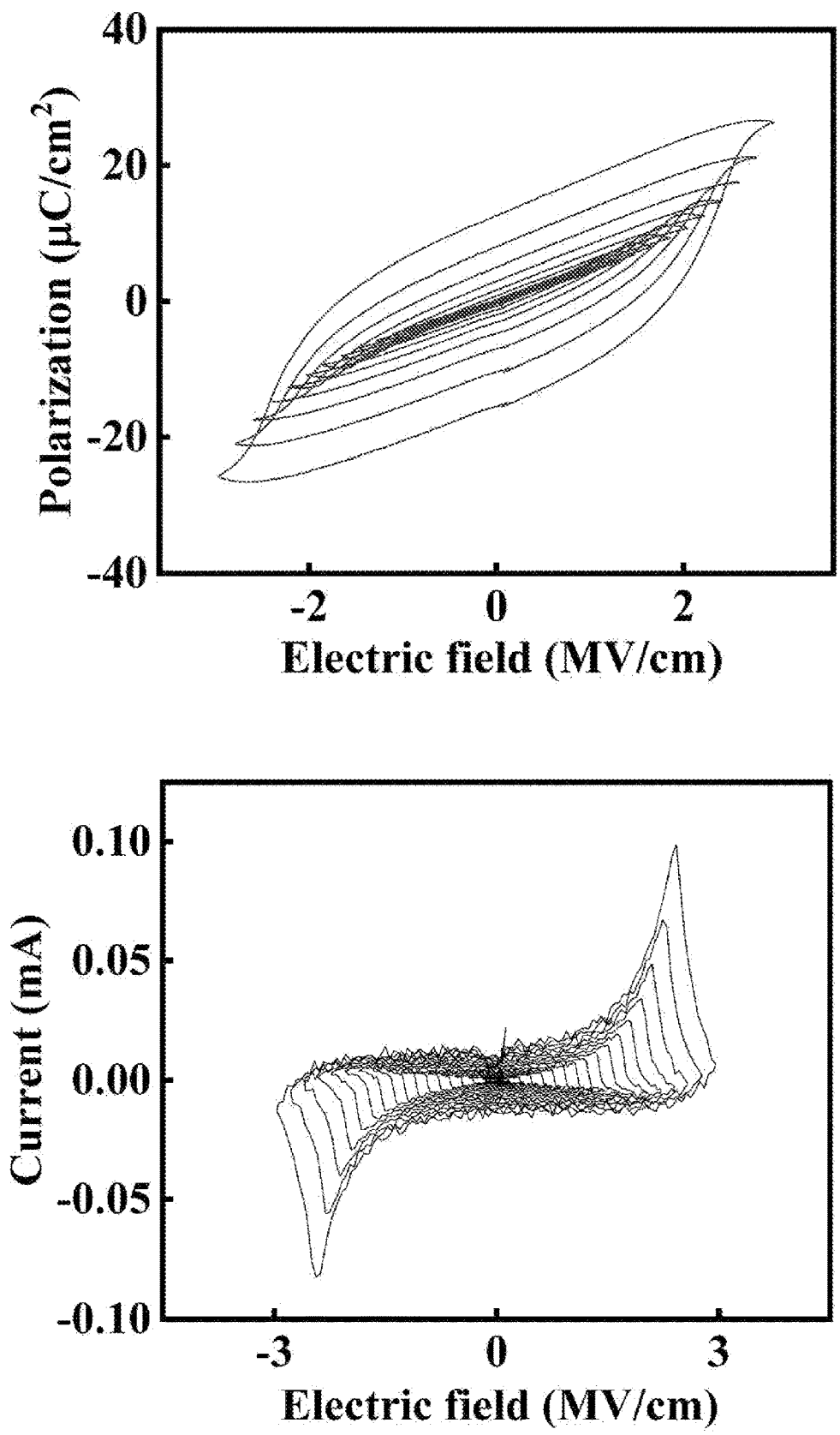
FIG. 24 includes graphs showing a hysteresis curve (upper graph) and a relationship between an electric field strength and a current (lower graph) in Example 14.

The following sputtering targets and the like were used for a sputtering apparatus. On a base material (substrate) 40A, an indium tin oxide (ITO) layer 30A having a thickness of 50 nm to 200 nm, a Pt(111) layer 20A having a thickness of 50 nm to 200 nm, and a ferroelectric thin film 10A having a thickness of 138 nm to 145 nm were produced multiple times as shown in FIG. 16.

Sc sputtering target material (concentration: 99.99%)
Al sputtering target material (concentration: 99.999%)
Sputtering gas: $N_2$ (purity: 99.99995% or more)
Substrate heating temperature: 20° C. to 30° C.

Before the film forming experiments described above, the air pressure inside a sputtering chamber was reduced to a high vacuum of $10^{-6}$ Pa or lower using a vacuum pump, like Examples and Comparative Examples described above. Furthermore, a target surface was subjected to a cleaning treatment immediately after installation of the targets and immediately before each film forming experiment to prevent contamination by impurities such as oxygen.

A Pt electrode was provided on each of the ferroelectric thin films. An electric field strength was applied to the respective ferroelectric thin films shown in FIG. 17 using FCE-1/1A (manufactured by TOYO Corporation). FIGS. 18 to 22 illustrate the measurement results. As can be seen from FIGS. 18 to 22, the ferroelectric thin films each exhibit a clear hysteresis curve. Therefore, the ferroelectric thin films each have ferroelectric properties.

OTHER EMBODIMENTS

In the aforementioned embodiments, the ferroelectric thin film is described using an example of Sc-doped aluminum nitride ($Al_{1-x}Sc_xN$). However, the present invention is not limited to the embodiments. Examples of the ferroelectric thin film according to the present invention include $Al_{1-x}(Mg_{1-y}Nb_y)_xN$ ($0 \leq X \leq 1$, $0 \leq Y \leq 1$). Such a ferroelectric thin film is more inexpensive and has high ferroelectric properties and high stability.

X is preferably within the range of 0.01 or more and 0.7 or less, and Y is preferably within the range of 0 or more and 1 or less. X is more preferably within the range of more than 0.01 and 0.7 or less, and Y is more preferably within the range of more than 0 and less than 1.0. A ferroelectric thin film ($Al_{1-x}(Mg_{1-y}Nb_y)_xN$) having X and Y falling within such ranges is more inexpensive and has higher ferroelectric properties and higher stability. X is more preferably within the range of 0.57 or more and 0.63 or less, and Y is more preferably within the range of 0.365 or more and 0.532 or less. A ferroelectric thin film ($Al_{1-x}(Mg_{1-y}Nb_y)_xN$) having X and Y falling within such ranges has further higher ferroelectric properties and further higher stability.

Examples of the ferroelectric thin film include $Al_{1-x}Yb_xN$ ($0 \leq X \leq 1$). Such a ferroelectric thin film is more inexpensive and has high ferroelectric properties and high stability.

X is preferably within the range of more than 0 and less than 1, and more preferably within the range of 0.01 or more and 0.8 or less. A ferroelectric thin film ($Al_{1-x}Yb_xN$) having X falling within such a range is more inexpensive and has higher ferroelectric properties and higher stability. X is more preferably within the range of 0.25 or more and 0.282 or less. A ferroelectric thin film ($Al_{1-x}Yb_xN$) having X falling within such a range has further higher ferroelectric properties and further higher stability.

Examples of the ferroelectric thin film according to the present invention include Ga1-$Ga_{1-x}Sc_xN$ ($0 \leq X \leq 1$). Such a ferroelectric thin film has high ferroelectric properties and high stability.

X is preferably within the range of 0 or more and less than 1, more preferably within the range of more than 0 and less than 1, further preferably within the range of 0 or more and 0.50 or less, and particularly preferably within the range of more than 0 and 0.50 or less. A ferroelectric thin film ($Ga_{1-x}Sc_xN$) having X falling within such a range has higher ferroelectric properties and higher stability. X is more preferably within the range of 0 or more and 0.41 or less, and particularly preferably within the range of more than 0 and 0.41 or less. A ferroelectric thin film ($Ga_{1-x}Sc_xN$) having X falling within such a range has further higher ferroelectric properties and further higher stability.

Examples of the ferroelectric thin film according to the present invention include GaN. Such a ferroelectric thin film has high ferroelectric properties and high stability.

The ferroelectric thin films described above can be actually produced using the same production method as that in the first embodiment.

Examples 14 to 24

Thin films shown in FIG. 23 were produced on a substrate (Si, Hf, Ti) by the aforementioned film-forming method. Herein, a "laminating order" indicates an order of laminating each film on the substrate. The laminating order means that layers are laminated in turn from a right layer to a left layer. For example, "$Al_{0.37}Mg_{0.4}Nb_{0.23}N/Si$" means that an $Al_{0.37}Mg_{0.4}Nb_{0.23}N$ layer is formed on an Si substrate. A "ferroelectric layer thickness" refers to the thickness of each corresponding layer.

Similarly to Examples described above, a Pt electrode was provided on each of the ferroelectric thin films, an electric field strength was applied to the respective ferroelectric thin films shown in FIG. 23 using FCE-1/1A (manufactured by TOYO Corporation). FIGS. 24 to 34 illustrate the measurement results. As can be seen from FIGS. 24 to 34, the ferroelectric thin films each exhibit a clear hysteresis curve. Therefore, the ferroelectric thin films each have ferroelectric properties.

In the aforementioned embodiments, the type and the pressure of sputtering gas used in the sputtering method are not particularly limited. When the molar concentration of nitrogen contained in the sputtering gas is within the range of 0.667 to 1.0 and the pressure of the sputtering gas is 1 Pa or less, a ferroelectric thin film having a higher remanent polarization value (Pr) can be provided. Note that a gas other than nitrogen contained in the sputtering gas is not particularly limited as long as it is an inert gas.

Examples 25 to 27

The following sputtering targets and the like were used for a sputtering apparatus. On each of three n-type Si substrates each having a specific resistance of 0.02 Ωcm, a $SiO_2$ layer having a thickness of 50 nm to 200 nm, a $TiO_2$ layer having a thickness of 5 nm to 50 nm, and a Pt(111) layer having a thickness of 50 nm to 200 nm were formed, and a ferroelectric thin film ($Al_{1-x}Sc_xN$) shown in FIG. 35 was produced by the aforementioned production method 1. Note that during film forming, the molar concentration of nitrogen and the molar concentration of argon contained in the sputtering gas were only changed as shown in FIG. 36.

Figure 37:
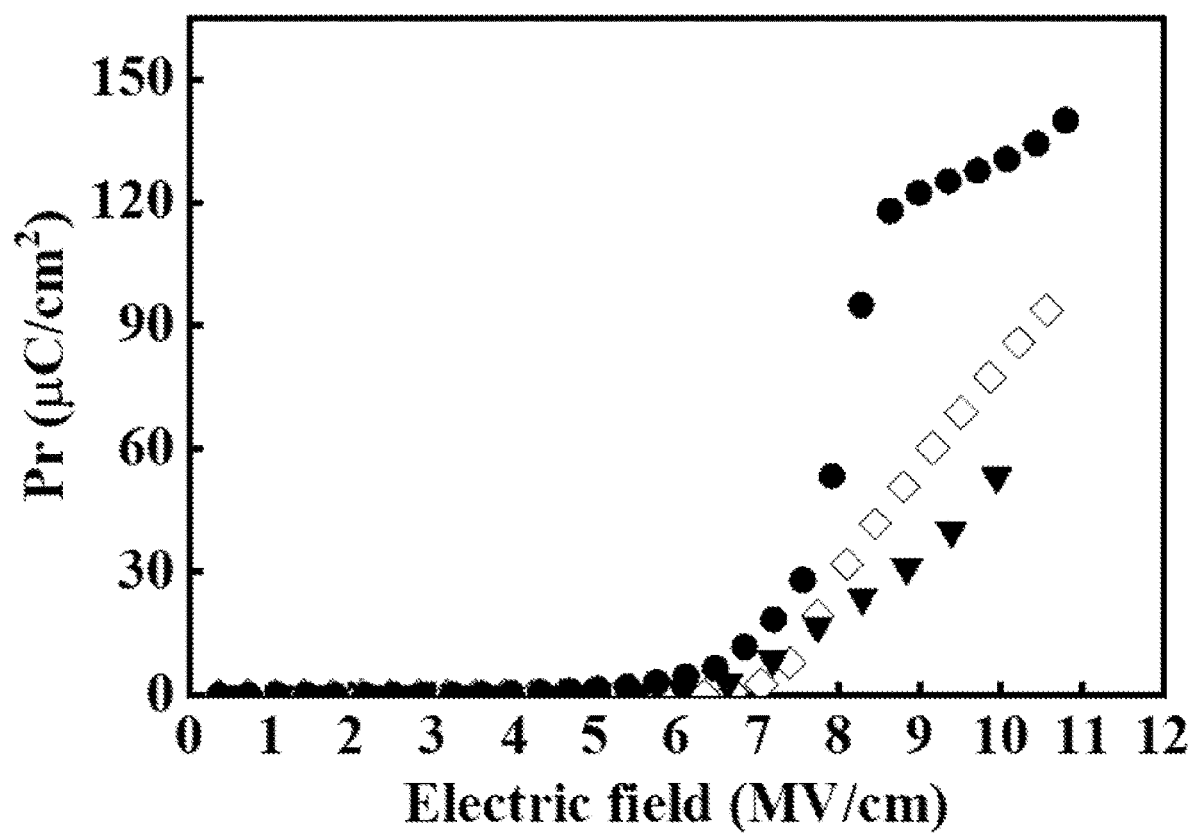
FIG. 37 is a graph showing a relationship between an electric field strength and a remanent polarization value (Pr) in ferroelectric thin films produced using the respective sputtering gases.

Sc sputtering target material (concentration: 99.99%)
Al sputtering target material (concentration: 99.999%)
Sputtering gas: mixed gas of $N_2$ (purity: 99.99995% or more) and Ar (purity: 99.9999% or more)
Pressure of sputtering gas: 0.667 Pa For each of the obtained ferroelectric thin films, electric field-polarization characteristics were measured. FIG. 37 illustrates the results. In FIG. 37, a black filled circle represents Example 25, an open rhombus represents Example 26, and a black filled inverted triangle represents Example 27. As can be seen from FIG. 37, as the molar concentration of nitrogen contained in the sputtering gas is higher, the remanent polarization value (Pr) is higher.

Figure 38:
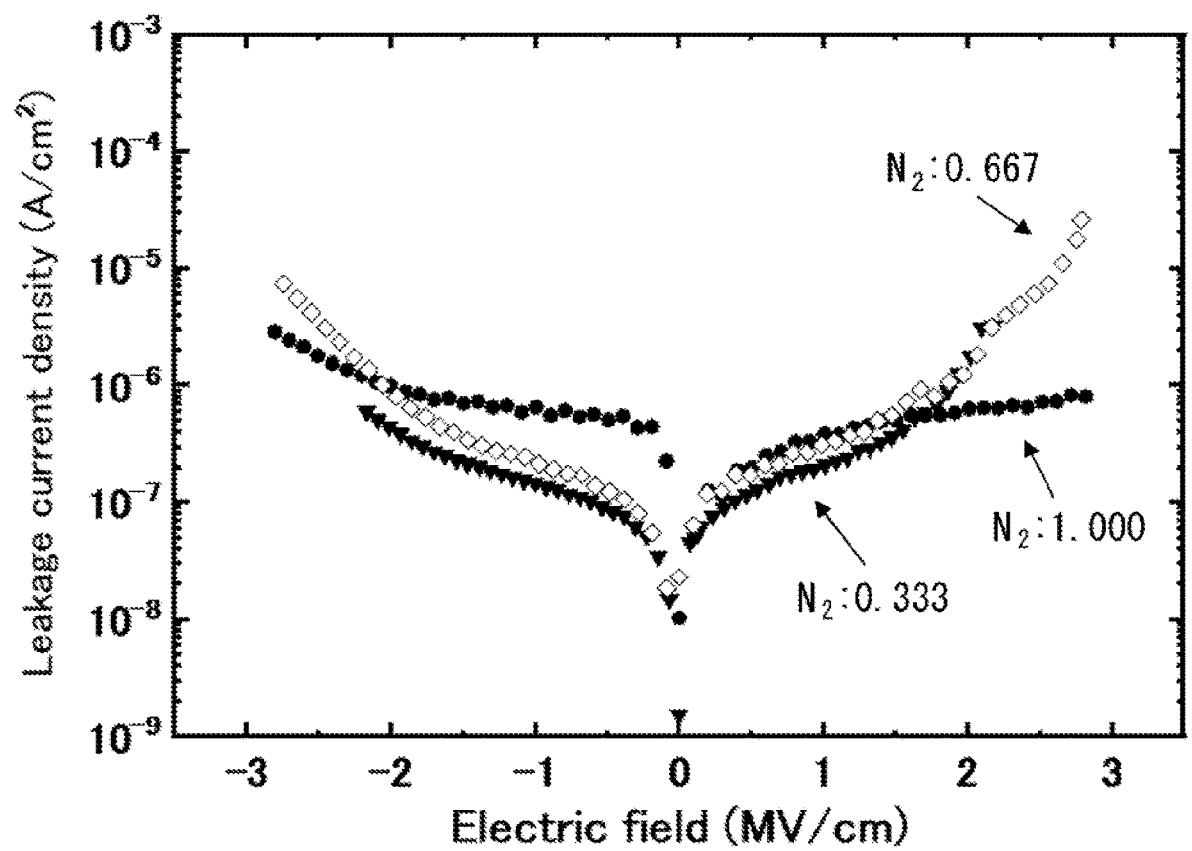
FIG. 38 is a graph showing a relationship between an electric field strength and a leakage current density in ferroelectric thin films produced using the respective sputtering gases.

A Pt electrode was provided on each of the ferroelectric thin films. An electric field strength was applied to the respective ferroelectric thin films using a direct current with FCE-1/1A (manufactured by TOYO Corporation), and a leakage current density at that time was measured. FIG. 38 illustrates the results. As can be seen from FIG. 38, the leakage current density in Example 27 could not be measured under application of an electric field of 2.20 MV/cm or more since dielectric breakdown occurred under application of an electric field strength of 2.20 MV/cm. On the other hand, the leakage current density in Example 26 abruptly increased under application of an electric field strength of higher than 2.75 MV/cm, but dielectric breakdown did not occur. Similarly, the leakage current density in Example 25 was lower than that in Example 26, and dielectric breakdown did not occur. From the results of Examples 25 and 26, it is considered that for the ferroelectric thin film produced using the sputtering gas in which the molar concentration of nitrogen is within the range of 0.667 to 1.0, dielectric breakdown does not occur even when an electric field strength of 2.20 MV/cm or more is applied. Note that under a condition where the pressure of the sputtering gas is 1 Pa or less, a ferroelectric thin film similar to the ferroelectric thin films is obtained.

Therefore, by using a sputtering gas in which the molar concentration of nitrogen is within the range of 0.667 to 1.0 and the pressure is 1 Pa or less, a ferroelectric thin film having a high remanent polarization value can be produced without causing dielectric breakdown even when a high electric field strength is applied.

It is considered that when a sputtering gas that satisfies the condition is used for production, all the ferroelectric thin films described herein can similarly have a high remanent polarization value without causing dielectric breakdown even when a high electric field strength is applied.

REFERENCE SIGNS LIST 10, 10A ferroelectric thin film
20, 20A Pt(111) layer
30 $TiO_2$ layer
30A ITO layer
40 $SiO_2$ layer
40A base material (substrate)
50 Si substrate

The invention claimed is:

1. A ferroelectric thin film represented by a chemical formula $M1_{1-x}M2_xN$, the ferroelectric thin film having ferroelectric properties and exhibiting reversible positive and negative polarization reversal,
   wherein M1 is at least one element selected from Al and Ga, M2 is at least one element selected from Mg, Sc, Yb, and Nb, and X is within a range of 0 or more and 1 or less,
   a crystal structure thereof is a wuzrite structure, and
   a thickness thereof is within a range of 1 nm to 200 nm.

2. The ferroelectric thin film according to claim 1, wherein M1 is Al, M2 is Sc, and X is within a range of more than 0 and 0.219 or less.

3. The ferroelectric thin film according to claim 1, wherein M1 is Al, M2 is Sc, and X is within a range of 0.065 or more and 0.219 or less.

4. The ferroelectric thin film according to claim 1, wherein M1 is Al, M2 is Sc, and X is within a range of 0.16 or more and 0.219 or less.

5. The ferroelectric thin film according to claim 1, wherein M1 is Al, M2 is $Mg_{1-y}Nb_y$, X is within a range of 0 or more and 1 or less, and Y is within a range of 0 or more and 1 or less.

6. The ferroelectric thin film according to claim 1, wherein M1 is Ga, M2 is Sc, and X is within a range of 0 or more and 1 or less.

7. The ferroelectric thin film according to claim 1, wherein M1 is Al, M2 is Yb, and X is within a range of 0 or more and 1 or less.

8. The ferroelectric thin film according to claim 1, wherein M1 is Ga, and X is 0.

9. The ferroelectric thin film according to claim 1, wherein u calculated by the following expression is within a range of 0.375 or more and less than 0.5:

$$u = \frac{1}{3}\frac{a^2}{c^2} + 0.25$$

(in the expression, a is an a-axis lattice constant in a crystal structure of the ferroelectric thin film, and c is a c-axis lattice constant).

10. The ferroelectric thin film according to claim 1, having a thickness of 1 nm to 100 nm.

11. The ferroelectric thin film according to claim 1, having a thickness of 20 nm to 80 nm.

12. A ferroelectric thin film comprising the ferroelectric thin film according to claim 1 which is provided on a low-heat resistant base material.

13. An electronic device using the ferroelectric thin film according to claim 1.

14. The ferroelectric thin film according to claim 1, wherein a remanent polarization value is within a range of 50 $\mu C/cm^2$ or more and 200 $\mu C/cm^2$ or less.

15. The ferroelectric thin film according to claim 1, wherein a remanent polarization value is within a range of 100 $\mu C/cm^2$ or more and 200 $\mu C/cm^2$ or less.

16. The ferroelectric thin film according to claim 1, wherein a remanent polarization value is within a range of 3 $\mu C/cm^2$ or more and 150 $\mu C/cm^2$ or less.

17. The ferroelectric thin film according to claim 1, wherein a remanent polarization value is within a range of 3 $\mu C/cm^2$ or more and 20 $\mu C/cm^2$ or less.

* * * * *